(12) United States Patent
Hu et al.

(10) Patent No.: US 11,011,390 B2
(45) Date of Patent: *May 18, 2021

(54) MICRO DEVICE STABILIZATION POST

(71) Applicant: Apple Inc., Cupertino, CA (US)

(72) Inventors: Hsin-Hua Hu, Los Altos, CA (US);
Andreas Bibl, Los Altos, CA (US);
John A. Higginson, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 16/545,921

(22) Filed: Aug. 20, 2019

(65) Prior Publication Data
US 2019/0371623 A1 Dec. 5, 2019

Related U.S. Application Data

(60) Continuation of application No. 15/445,476, filed on Feb. 28, 2017, now Pat. No. 10,424,493, which is a
(Continued)

(51) Int. Cl.
*H01L 21/52* (2006.01)
*H01L 25/075* (2006.01)
(Continued)

(52) U.S. Cl.
CPC .......... *H01L 21/52* (2013.01); *H01L 21/6835* (2013.01); *H01L 21/6836* (2013.01); *H01L 24/83* (2013.01); *H01L 24/93* (2013.01); *H01L 24/95* (2013.01); *H01L 25/0753* (2013.01); *H01L 25/50* (2013.01); *H01L 27/156* (2013.01);
(Continued)

(58) Field of Classification Search
CPC ... H01L 25/0753; H01L 25/50; H01L 27/156; H01L 21/52; H01L 21/6835; H01L 21/6836; H01L 33/0093; H01L 33/40; H01L 24/83; H01L 24/93; H01L 24/95
See application file for complete search history.

(56) References Cited

U.S. PATENT DOCUMENTS 5,592,358 A   1/1997   Shamouilian et al.
5,839,187 A   11/1998  Sato et al.
(Continued)

FOREIGN PATENT DOCUMENTS

CN   101901570 A   12/2010
CN   102044600 A   5/2011
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Sue A Purvis
*Assistant Examiner* — Scott Stowe
(74) *Attorney, Agent, or Firm* — Jaffery Watson Mendonsa & Hamilton LLP

(57) ABSTRACT

A method and structure for stabilizing an array of micro devices is disclosed. The array of micro devices is formed on an array of stabilization posts formed from a thermoset material. Each micro device includes a bottom surface that is wider than a corresponding stabilization post directly underneath the bottom surface.

19 Claims, 19 Drawing Sheets

Related U.S. Application Data continuation of application No. 14/466,497, filed on Aug. 22, 2014, now Pat. No. 9,741,592, which is a division of application No. 13/625,825, filed on Sep. 24, 2012, now Pat. No. 8,835,940.

(51) Int. Cl.

| | | |
|---|---|---|
| *H01L 27/15* | (2006.01) | |
| *H01L 23/00* | (2006.01) | |
| *H01L 33/00* | (2010.01) | |
| *H01L 21/683* | (2006.01) | |
| *H01L 25/00* | (2006.01) | |
| *H01L 33/40* | (2010.01) | |

(52) U.S. Cl.
CPC .......... *H01L 33/0093* (2020.05); *H01L 33/40* (2013.01); *H01L 2221/6835* (2013.01); *H01L 2224/95136* (2013.01); *H01L 2924/12041* (2013.01); *H01L 2924/12042* (2013.01); *H01L 2924/1461* (2013.01)

(56) References Cited

U.S. PATENT DOCUMENTS

| | | |
|---|---|---|
| 5,851,664 A | 12/1998 | Bennett et al. |
| 5,888,847 A | 3/1999 | Rosoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,130,445 A | 10/2000 | Wang et al. |
| 6,319,778 B1 | 11/2001 | Chen et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,586,875 B1 | 7/2003 | Chen et al. |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,762,069 B2 | 7/2004 | Huang et al. |
| 6,786,390 B2 | 9/2004 | Yang |
| 6,878,607 B2 | 4/2005 | Inoue et al. |
| 6,946,322 B2 | 9/2005 | Brewer |
| 7,015,513 B2 | 3/2006 | Hsieh |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,560,738 B2 | 7/2009 | Liu |
| 7,585,703 B2 | 9/2009 | Matsumura et al. |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,953,134 B2 | 5/2011 | Chin et al. |
| 7,972,875 B2 | 7/2011 | Rogers et al. |
| 7,999,454 B2 | 8/2011 | Winters et al. |
| 8,023,248 B2 | 9/2011 | Yonekura et al. |
| 8,333,860 B1 | 12/2012 | Bibi et al. |
| 8,349,116 B1 | 1/2013 | Bibi et al. |
| 8,835,940 B2 | 9/2014 | Hu |
| 8,941,215 B2 | 1/2015 | Hu et al. |
| 9,741,592 B2 | 8/2017 | Hu et al. |
| 2001/0029088 A1 | 10/2001 | Odajima et al. |
| 2002/0076848 A1 | 6/2002 | Spooner et al. |
| 2003/0177633 A1 | 9/2003 | Haji et al. |
| 2005/0127382 A1 | 6/2005 | Groetsch et al. |
| 2007/0166851 A1 | 7/2007 | Tran |
| 2007/0231943 A1 | 10/2007 | Ouellet et al. |
| 2008/0163481 A1 | 7/2008 | Shida et al. |
| 2008/0315236 A1 | 12/2008 | Lu et al. |
| 2009/0068774 A1 | 3/2009 | Slater |
| 2009/0314991 A1 | 12/2009 | Cho et al. |
| 2010/0171094 A1 | 7/2010 | Lu et al. |
| 2010/0176415 A1 | 7/2010 | Lee et al. |
| 2010/0188794 A1 | 7/2010 | Park et al. |
| 2010/0203661 A1 | 8/2010 | Hodota |
| 2010/0244077 A1 | 9/2010 | Yao |
| 2010/0248484 A1 | 9/2010 | Bower et al. |
| 2010/0317132 A1 | 12/2010 | Rogers et al. |
| 2011/0003410 A1 | 1/2011 | Tsay et al. |
| 2011/0089464 A1 | 4/2011 | Lin et al. |
| 2011/0165707 A1 | 7/2011 | Lott et al. |
| 2012/0006464 A1 | 3/2012 | Huang et al. |
| 2012/0134065 A1 | 5/2012 | Furuya et al. |
| 2013/0128585 A1 | 5/2013 | Bibi et al. |
| 2017/0170049 A1 | 6/2017 | Hu |

FOREIGN PATENT DOCUMENTS

| | | |
|---|---|---|
| CN | 102072420 A | 5/2011 |
| JP | 3406207 | 5/1999 |
| WO | 2011123285 | 10/2011 |

OTHER PUBLICATIONS

Bower, C.A., et al., "Active-Matrix OLEO Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

"Cyclotene Advanced Electronic Resins—Processing Procedures for BCB Adhesion," The Dow Chemical Company, Revised Jun. 2007, pp. 1-10.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_ Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

Niklaus, et al., "Low-temperature full wafer adhesive bonding," Institute of Physics Bonding, Journal of Micromechanics and Microengineering, vol. 11, 2001, pp. 100-107.

PCT International Search Report and Written Opinion for International Application No. PCT/US2013/059807, dated Dec. 23, 2013, 13 pages.

(56) References Cited

OTHER PUBLICATIONS

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Wohrmann, et al., "Low Temperature Cure of BCB and the Influence on the Mechanical Stress," 2011 Electronic Components and Technology Conference, pp. 392-400.

Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maaastricht, The Netherlands. Published in the Technical Digest, ISBN 0-7803-8265-X, pp. 717-720, 4 pgs.

PCT International Preliminary Report on Patentability for International Application No. PCT/US2014/059807, dated Apr. 2, 2015, 11 pages.

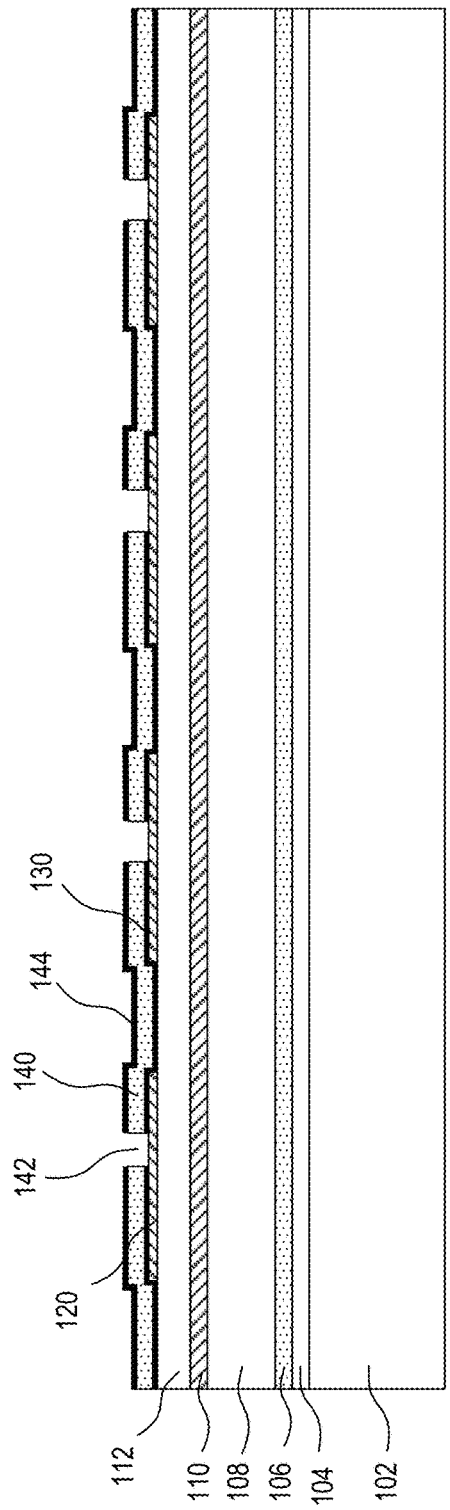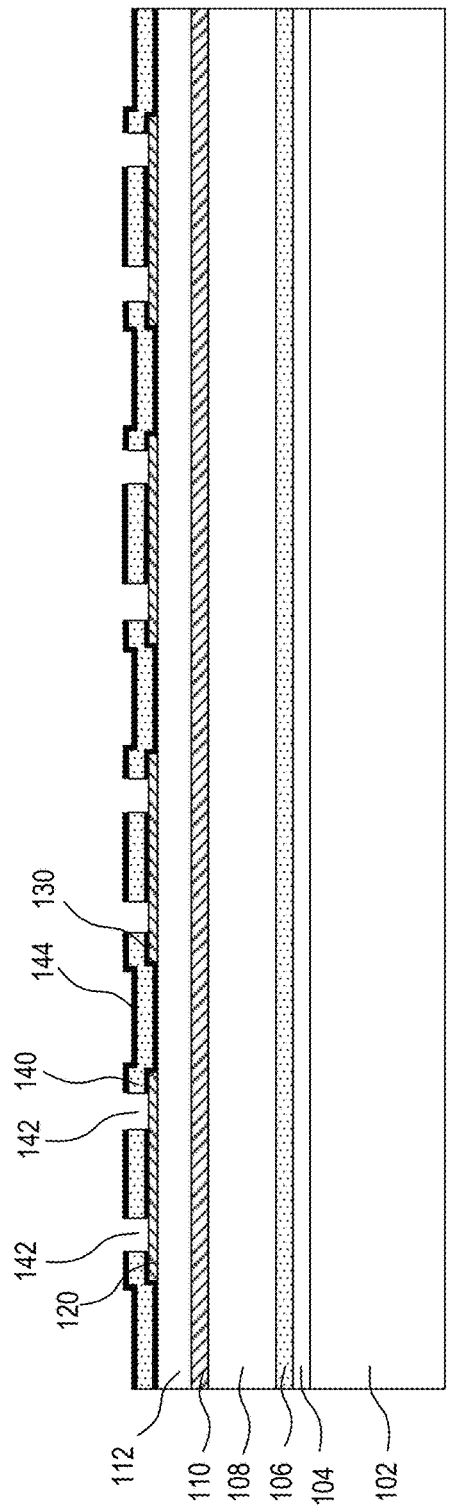

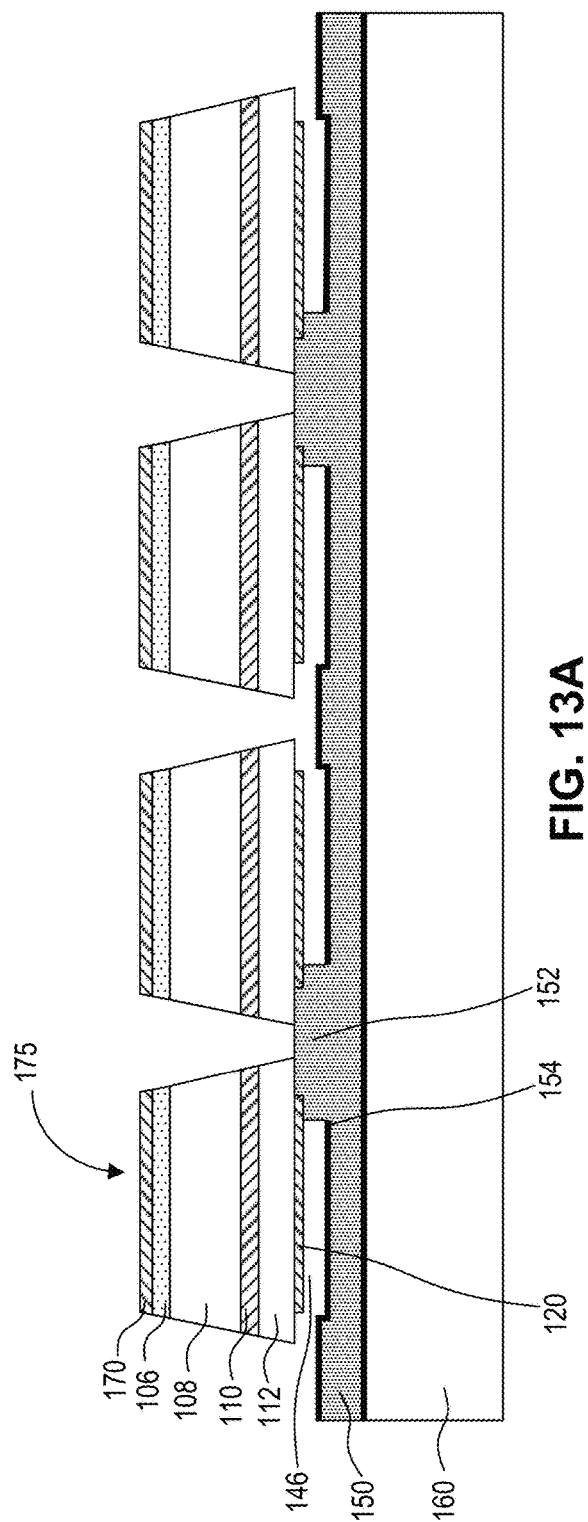
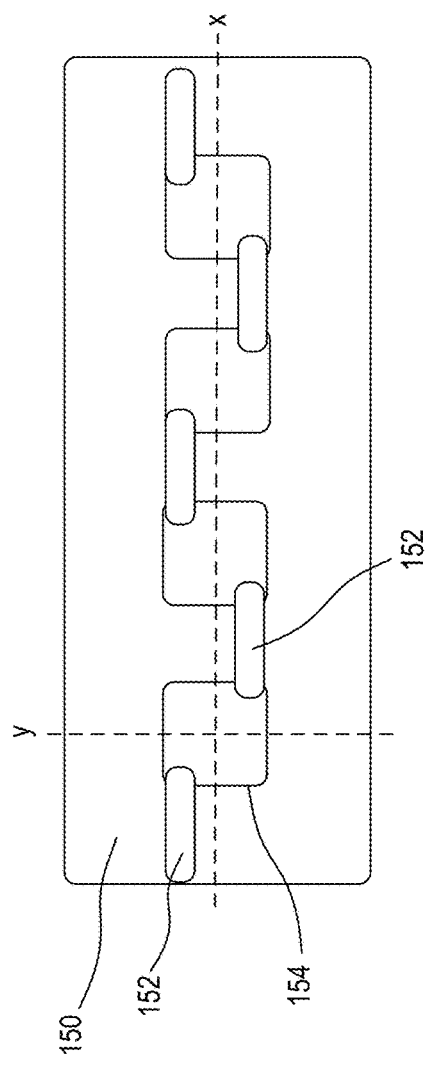
FIG. 13A
FIG. 13B

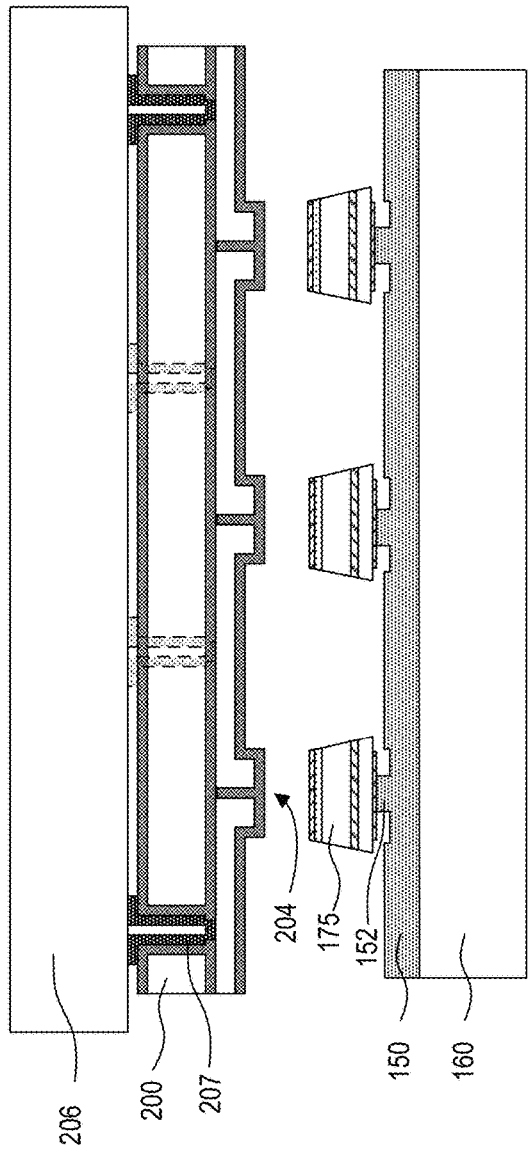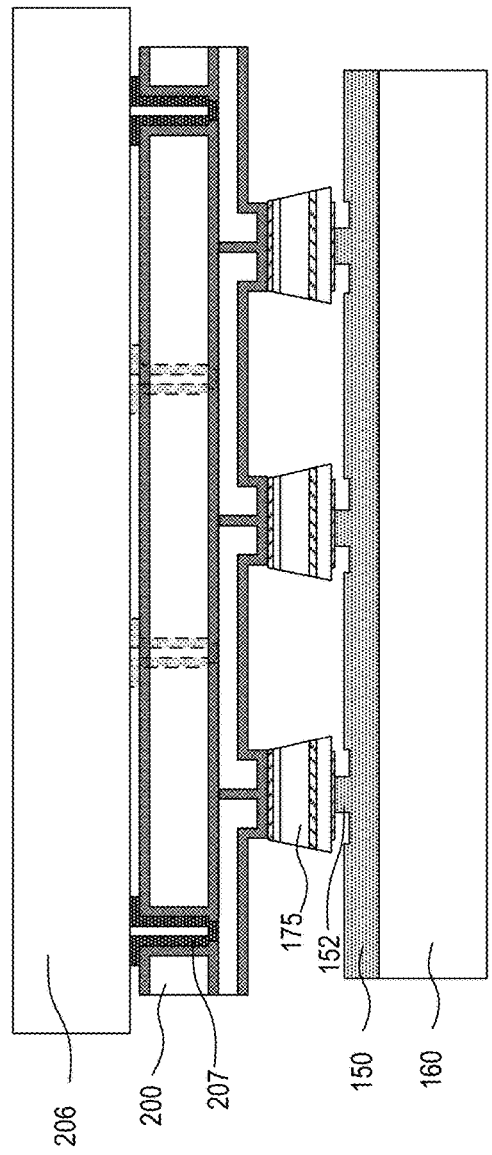

MICRO DEVICE STABILIZATION POST

RELATED APPLICATIONS

This application is a continuation application of co-pending U.S. patent application Ser. No. 15/445,476, filed Feb. 28, 2017, which is a continuation of U.S. patent application Ser. No. 14/466,497, filed Aug. 22, 2014, now U.S. Pat. No. 9,741,592, which is a divisional application of U.S. patent application Ser. No. 13/625,825 filed Sep. 24, 2012, now U.S. Pat. No. 8,835,940, which is incorporated herein by reference.

BACKGROUND

Field

The present invention relates to micro devices. More particularly embodiments of the present invention relate to the stabilization of micro device on a carrier substrate.

Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE INVENTION

A structure and method of forming an array of micro devices which are poised for pick up are disclosed. In an embodiment, a structure includes a stabilization layer including an array of stabilization posts, and the stabilization layer is formed of a thermoset material such as epoxy or benzocyclobutene (BCB) which is associated with 10% or less volume shrinkage during curing, or more particularly about 6% or less volume shrinkage during curing. An array of micro devices are on the array of stabilization posts, with each micro device including a bottom surface that is wider than a corresponding stabilization post directly underneath the bottom surface. An array of bottom conductive contacts may be formed on the bottom surfaces of the array micro devices. An array of top conductive contacts may be formed on top of the array of micro devices. In an embodiment the array of stabilization posts are separated by a pitch of 1 μm to 100 μm, or more specifically 1 μm to 10 μm.

The stabilization layer may be bonded to a carrier substrate. An adhesion promoter layer may be formed between the carrier substrate and the stabilization layer to increase adhesion. A sacrificial layer may also be located between the stabilization layer and the array of micro devices, where the array of stabilization posts also extend through a thickness of the sacrificial layer. In an embodiment, the sacrificial layer is formed of a material such as an oxide or nitride. An etch stop detection layer, such as titanium, may also be located between the sacrificial layer and the array of micro devices, with the array of stabilization posts extending through a thickness of the etch stop detection layer. An adhesion promoter layer may also be formed between the stabilization layer and the sacrificial layer to increase adhesion, where array of stabilization posts also extend through a thickness of the adhesion promoter layer.

The array of micro devices may be micro LED devices, and may be designed to emit a specific wavelength such as a red, green, or blue light. In an embodiment, each micro LED device includes a device layer formed of a p-doped semiconductor layer, one or more quantum well layers over the p-doped semiconductor layer, and an n-doped semiconductor layer. For example, where the micro LED device is designed to emit a red light, the p-doped layer may comprise GaP and the n-doped layer may comprise AlGaInP. The device layer lay also include an ohmic contact layer such as GaAs over the n-doped semiconductor layer.

The array of stabilization posts may be centered with an x-y center below the array of micro devices or may be off-centered with an x-y center below the array of micro devices. Each stabilization post may span underneath an edge of two adjacent micro devices. Also, two or more stabilization posts can be formed beneath each micro device.

In an embodiment, forming an array of micro devices includes forming an array of stabilization posts over a device layer, transferring the array of stabilization posts and the device layer to a carrier substrate, and patterning the device layer to form a corresponding array of micro devices over the array of stabilization posts. The patterned sacrificial layer may also be removed to form an open space below each micro device. Forming the array of stabilization posts may include forming a patterned sacrificial layer including an array of openings over the device layer, and forming a stabilization layer over the patterned sacrificial layer and within the array of openings to form the array of stabilization posts. In an embodiment, the array of openings is formed directly over an array of conductive contacts on the device layer.

Transferring the array of stabilization posts and the device layer to the carrier substrate may include bonding the stabilization layer to the carrier substrate. The stabilization layer may be soft-baked prior to bonding the stabilization layer to the carrier substrate, followed by hard-baking during or after bonding the stabilization layer to the carrier substrate. A growth substrate may also be removed from the device layer after bonding the stabilization layer to the carrier substrate and prior to patterning the device layer to form the array of micro devices. In an embodiment, a conductive contact layer is deposited over the device layer after removing the growth substrate, the conductive contact layer is annealed to form an ohmic contact with the device layer, and patterned to form an array of conductive contacts on the device layer directly over the array of stabilization posts. For example, annealing may be performed at a temperature of 300° C. or greater.

In an embodiment, a method includes patterning a sacrificial layer to form an array of openings in the sacrificial layer exposing an array of conductive contacts formed on a device layer, where the device layer includes an n-doped semiconductor layer, a p-doped semiconductor layer, and a quantum well layer between the n-doped semiconductor layer and the p-doped semiconductor layer. A thermosetting material is then applied over the sacrificial layer and within the array of openings, and the thermosetting material is cured to solidify the thermosetting material. Curing may be performed by either UV energy or heat. Curing may also achieve at least 70% cross-linking of the thermosetting material. The thermosetting material may additionally undergo 10% or less volume shrinkage during curing. In an embodiment, a growth substrate supporting the device layer may be bonded to a carrier substrate with the cured thermosetting material. In an embodiment, patterning the sacrificial layer and an etch stop detection layer underneath the sacrificial layer are patterned to form the array of openings exposing the array of conductive contacts. In an embodiment, completion of etching through the etch stop detection layer is detection with visual observation.

BRIEF DESCRIPTION OF THE DRAWINGS

FIGS. 3A-3D are cross-sectional side view illustrations of a patterned sacrificial layer formed over a bulk LED substrate in accordance with embodiments of the invention.

FIG. 13A is cross-sectional side view illustration of an array of micro LED devices formed on an array of stabilization posts after removal of the sacrificial layer in accordance with an embodiment of the invention.

FIG. 13B is a schematic top view illustration of stabilization post location in accordance with embodiments of the invention.

FIG. 14A is a cross-sectional side view illustration of an array of electrostatic transfer heads positioned over an array of micro devices on a carrier substrate in accordance with an embodiment of the invention.

FIG. 14B is a cross-sectional side view illustration of an array of electrostatic transfer heads in contact with an array of micro devices in accordance with an embodiment of the invention.

DETAILED DESCRIPTION OF THE INVENTION

Figure 1A:
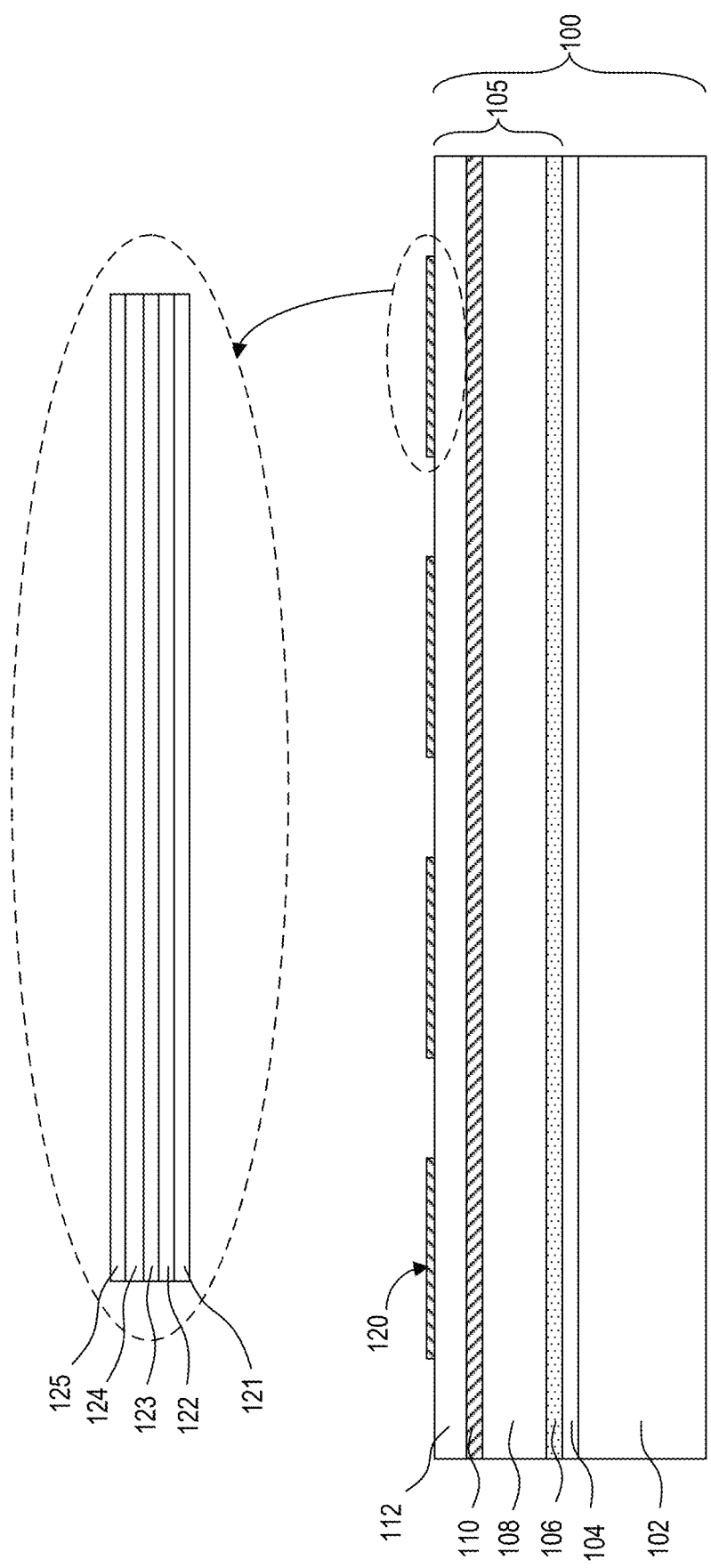
FIG. 1A is a cross-sectional side view illustration of a patterned conductive contact layer on a bulk LED substrate in accordance with an embodiment of the invention.

Embodiments of the present invention describe a method and structure for stabilizing an array of micro devices such as micro light emitting diode (LED) devices on a carrier substrate so that they are poised for pick up and transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments of the present invention are described with specific regard to micro LED devices comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED device as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 μm. In an embodiment, the top contact surface of each micro device or electrostatic transfer head has a maximum dimension of 1 to 100 μm, or more specifically 3 to 10 μm. In an embodiment, a pitch of an array of micro devices, and a corresponding array of electrostatic transfer heads is (1 to 100 μm) by (1 to 100 μm), for example a 10 μm by 10 μm pitch or 5 μm by 5 μm pitch.

In the following embodiments, the mass transfer of an array of pre-fabricated micro devices with an array of transfer heads is described. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 10 μm by 10 μm pitch, or 5 μm by 5 μm pitch. At these densities a 6 inch substrate, for example, can accommodate approximately 165 million micro LED devices with a 10 μm by 10 μm pitch, or approximately 660 million micro LED devices with a 5 μm by 5 μm pitch. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

In one aspect, embodiments of the invention describe a structure for stabilizing an array of micro devices such as micro light emitting diode (LED) devices on a carrier substrate so that they are poised for pick up and transfer to a receiving substrate. In an embodiment, an array of micro devices are held in place on an array of stabilization posts on a carrier substrate. In an embodiment, the stabilization posts are formed of an adhesive bonding material. In this manner, the array of stabilization posts may retain the array of micro devices in place on a carrier substrate while also providing a structure from which the array of micro devices is readily picked up. In an embodiment, the adhesive bonding material includes a thermoset material such as, but not limited to, benzocyclobutene (BCB) or epoxy. In an embodiment, the thermoset material may be associated with 10% or less volume shrinkage during curing, or more particularly about 6% or less volume shrinkage during curing. In this manner low volume shrinkage during curing of the adhesive bonding material may not cause delamination between the array of stabilization posts and the array of micro devices, and may allow for uniform adhesion between the array stabilization posts and the array of micro devices supported by the array of stabilization posts.

Without being limited to a particular theory, embodiments of the invention utilize transfer heads and head arrays which operate in accordance with principles of electrostatic grippers, using the attraction of opposite charges to pick up micro devices. In accordance with embodiments of the present invention, a pull-in voltage is applied to a transfer head in order to generate a grip pressure on a micro device and pick up the micro device. In accordance with embodiments of the invention, the minimum amount pick up pressure required to pick up a micro device from a stabilization post can be determined by the adhesion strength between the adhesive bonding material from which the stabilization posts are formed and the micro device (or any intermediate layer), as well as the contact area between the top surface of the stabilization post and the micro device. For example, adhesion strength which must be overcome to pick up a micro device is related to the minimum pick up pressure generated by a transfer head as provided in equation (1):

$$P_1 A_1 = P_2 A_2 \quad (1)$$

where $P_1$ is the minimum grip pressure required to be generated by a transfer head, $A_1$ is the contact area between a transfer head contact surface and micro device contact surface, $A_2$ is the contact area on a top surface of a stabilization post, and $P_2$ is the adhesion strength on the top surface of a stabilization post. In an embodiment, a grip pressure of greater than 1 atmosphere is generated by a transfer head. For example, each transfer head may generate a grip pressure of 2 atmospheres or greater, or even 20 atmospheres or greater without shorting due to dielectric breakdown of the transfer heads. Due to the smaller area, a higher pressure is realized at the top surface of the corresponding stabilization post than the grip pressure generate by a transfer head.

In an embodiment, a bonding layer which is remeltable or reflowable is placed between each micro device and stabilization post. In such an embodiment, heat can be applied to the bonding layer to create a phase change from solid to liquid state prior to or during the pick up operation, or during placement of the micro device on the receiving substrate. In the liquid state the bonding layer may retain the micro device in place on the stabilization post while also providing a medium from which the micro device is readily releasable. In this circumstance the surface tension forces of the liquid bonding layer holding the micro device to the stabilization post may become dominant over other forces holding the micro device. These surface tension forces may be comparatively less than adhesion forces associated with the adhesive bonding material in the stabilization posts, and therefore require less grip pressure for pick up. Partial pick up and transfer of the bonding layer to the receiving substrate may also assist in bonding the micro device to the receiving substrate.

In another embodiment, the bonding layer is formed of a material characterized by a low tensile strength. For example, indium is characterized by a tensile strength of approximately 4 MPa which can be less than or near the adhesion strength between a gold/BCB bonding interface of 10 MPa or less, and which is significantly lower than an exemplary 30 MPa adhesion strength between a gold/BCB bonding interface (determined with stud pull test) when treated with adhesion promoter AP3000, an organosilane compound in 1-methoxy-2-propoanol available from The Dow Chemical Company. In an embodiment, the bonding layer is cleaved during the pick up operation due to the lower tensile strength, and a phase change is not created curing the pick up operation. Though, a phase change may still be created in the portion of the bonding layer which is picked up with the micro device during placement of the micro device onto a receiving substrate to aid in bonding of the micro device to the receiving substrate.

In another aspect, embodiments of the invention describe a manner of forming an array of micro devices which are poised for pick up in which conductive contact layers can be formed on top and bottom surfaces of the micro devices, and annealed to provide ohmic contacts. Where a conductive contact is formed on a top surface of a micro device, the stabilization layer is formed of a material which is capable of withstanding the associated deposition and annealing temperatures. For example, a conductive contact may require annealing at temperatures between 200° C. to 350° C. to form an ohmic contact with the micro device. In this manner, embodiments of the invention may be utilized to form arrays of micro LED devices based upon a variety of different semiconductor compositions for emitting various different visible wavelengths. For example, micro LED growth substrates including active devices layers formed of different materials for emitting different wavelengths (e.g. red, green, and blue wavelengths) can all be processed within the general sequence of operations of the embodiments.

FIG. 1A is a cross-sectional side view illustration of a patterned conductive contact layer on a bulk LED substrate in accordance with an embodiment of the invention. Specifically, the bulk LED substrate illustrated in FIG. 1A is a bulk LED substrate designed for emission of red light (e.g. 620-750 nm wavelength). It is to be appreciated, that while the specific embodiments illustrated and described in the following description are made with reference to the formation of red emitting LED devices, that the following sequences and descriptions are also applicable to the formation of other LED devices such as green emitting LED devices (e.g. 495-570 nm wavelength) formed of materials such as indium gallium nitride (InGaN), gallium nitride (GaN), gallium phosphide (GaP), aluminum gallium indium phosphide (AlGaInP), and aluminum gallium phosphide (AlGaP), or blue emitting LED devices (e.g. 450-495 nm wavelength) formed of materials such as gallium nitride (GaN), indium gallium nitride (InGaN), and zinc selenide (ZnSe).

In an embodiment, a bulk LED substrate 100 includes a device layer 105 formed on a growth substrate 102. An optional etch stop layer 104 may be formed between the device layer 105 and the growth substrate to aid in the subsequent removal of the growth substrate 102. The device layer 105 may include a doped semiconductor layer 108 (e.g. n-doped), one or more quantum well layers 110, and a doped semiconductor layer 112 (e.g. p-doped). The device layer 105 may optionally including an ohmic layer 106 between the doped semiconductor layer 108 and the growth substrate 102 to aid in the subsequent formation of an ohmic contact with the device layer. The etch stop layer 104 and device layer 105 may be formed on the growth substrate 102 by a variety of techniques. In an embodiment, the etch stop layer 104 and device layer 105 are formed by one or more heterogeneous epitaxial growth techniques. A conductive contact layer may then be formed over the bulk LED substrate device layer 105 using a suitable technique such as sputtering or electron beam physical deposition followed by etching or liftoff to form the array of conductive contacts 120.

In the particular embodiment illustrated the growth substrate 102 is formed of GaAs, and may be approximately 500 μm thick. The etch stop layer 104 may be formed of InGaP and approximately 2,000 angstroms thick. The ohmic layer 106 may be formed of GaAs and approximately 500 angstroms thick. In an embodiment, n-doped layer 108 is formed of AlGaInP, and is approximately 1 μm to 3 μm thick. The one or more quantum well layers 110 may have a thickness of approximately 0.5 μm. In an embodiment, p-doped layer 112 is formed of GaP, and is approximately 1 μm to 2 μm thick.

In an embodiment, the array of conductive contacts 120 have a thickness of approximately 0.1 μm-2 μm, and may include a plurality of different layers. For example, a conductive contact 120 may include an electrode layer 121 for ohmic contact, a mirror layer 122, an adhesion/barrier layer 123, a diffusion barrier layer 125, and a bonding layer 125. In an embodiment, electrode layer 121 may make ohmic contact to the p-doped GaP layer 112, and may be formed of a high work-function metal such as nickel. In an embodiment, a mirror layer 122 such as silver is formed over the electrode layer 121 to reflect the transmission of the visible wavelength. In an embodiment, titanium is used as an adhesion/barrier layer 123, and platinum is used as a diffusion barrier 124 to bonding layer 125. Bonding layer 125 may be formed of a variety of materials which can be chosen for bonding to the receiving substrate and/or to achieve the requisite tensile strength or adhesion or surface tension with the stabilization posts. Following the formation of layers 121-125, the substrate stack can be annealed to form an ohmic contact. For example, a p-side ohmic contact may be formed by annealing the substrate stack at 510° C. for 10 minutes.

In an embodiment, bonding layer 125 is formed of a conductive material (both pure metals and alloys) which can diffuse with a metal forming a contact pad on a receiving substrate (e.g. gold, indium, or tin contact pad) and has a liquidus temperature above 200° C. such as tin (231.9° C.) or bismuth (271.4° C.), or a liquidus temperature above 300° C. such as gold (1064° C.) or silver (962° C.). In some embodiments, bonding layer 125 such as gold may be selected for its poor adhesion with the adhesive bonding material used to form the stabilization posts. For example, noble metals such as gold are known to achieve poor adhesion with BCB. In this manner, sufficient adhesion is created to maintain the array of micro LED devices on the stabilization posts during processing and handling, as well as to maintain adjacent micro LED devices in place when another micro LED device is being picked up, yet also not create too much adhesion so that pick up can be achieved with an applied pick up pressure on the transfer head of 20 atmospheres or less, or more particularly 5-10 atmospheres.

In the embodiment illustrated in FIG. 1A, where bonding layer 125 has a liquidus temperature above the annealing temperature for forming the p-side ohmic contact, the anneal (eg. 510° C. for 10 minutes) can be performed after the formation of the patterned conductive contact layer 120, including bonding layer 125. Where bonding layer 125 has a liquidus temperature below the annealing temperature for forming the p-side ohmic contact, the bonding layer 125 may be formed after annealing.

Figure 1B:
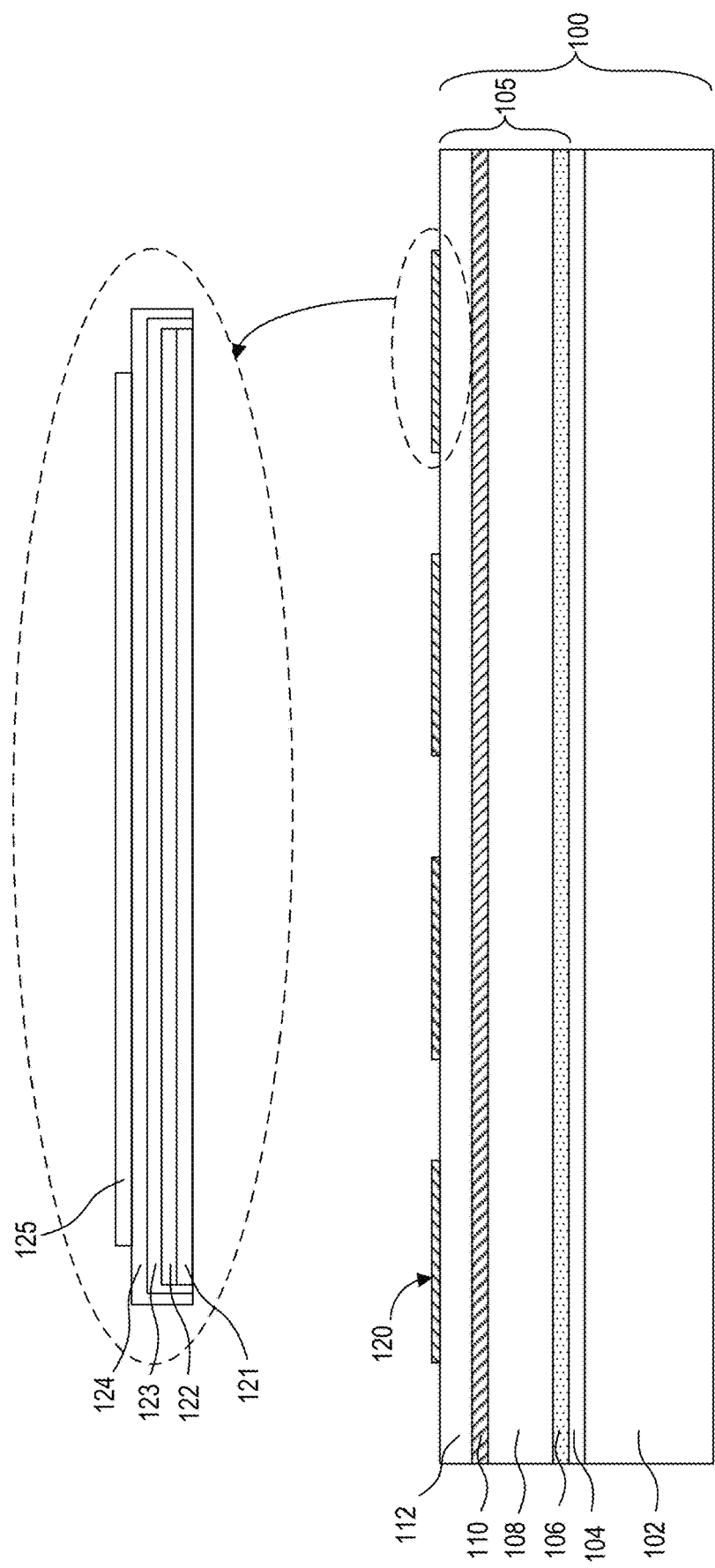
FIG. 1B is a cross-sectional side view illustration of a patterned conductive contact layer on a bulk LED substrate in accordance with an embodiment of the invention.

FIG. 1B is a cross-sectional side view illustration similar to that of FIG. 1A of a patterned conductive contact layer on a bulk LED substrate in accordance with an embodiment of the invention. The embodiment illustrated in FIG. 1B may be particularly useful where bonding layer 125 is formed of a material with a liquidus temperature below the annealing temperature of the p-side ohmic contact or n-side ohmic contact yet to be formed, though the embodiment illustrated in FIG. 1B is not limited to such and may be used where the bonding layer 125 is formed of a material with a liquidus temperature above the annealing temperature of the p-side ohmic contact or n-side ohmic contact yet to be formed. In such embodiments, electrode layer 121 and mirror layer 122 may be formed similarly as described with regard to FIG. 1A. Likewise, adhesion/barrier layer 123 and diffusion barrier 124 may be formed similarly as described with regard to FIG. 1A with one difference being that the layers 123, 124 may optionally wrap around the sidewalls of the layers 121, 122. Following the formation of layers 121-124, the substrate stack can be annealed to form an ohmic contact. For example, a p-side ohmic contact may be formed by annealing the substrate stack at 510° C. for 10 minutes. After annealing layer 121-124 to form the p-side ohmic contact, the bonding layer 125 may be formed. In an embodiment, the bonding layer 125 has a smaller width than for layers 121-124.

In an embodiment, bonding layer 125 has a liquidus temperature or melting temperature of approximately 350° C. or lower, or more specifically of approximately 200° C. or lower. At such temperatures the bonding layer may undergo a phase change without substantially affecting the other components of the micro LED device. In an embodiment, the resultant bonding layer may be electrically conductive. In accordance with some embodiments, the bonding layer 125 may be a solder material, such as an indium, bismuth, or tin based solder, including pure metals and metal alloys. In a particular embodiment, the bonding layer 125 is indium.

Figure 2:
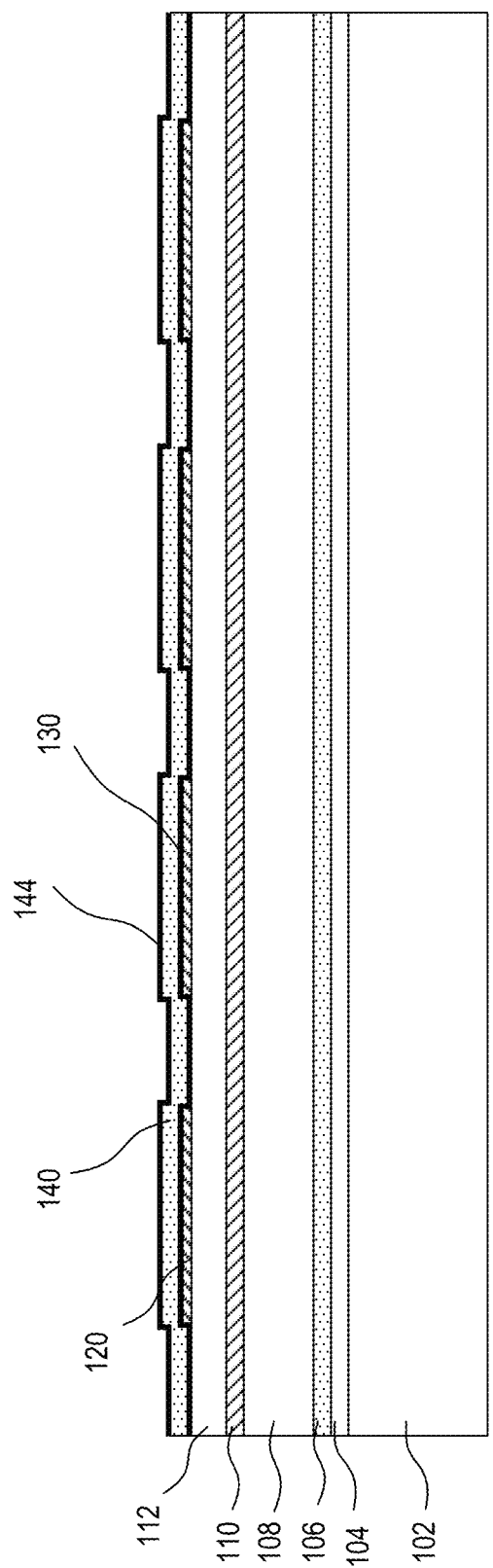
FIG. 2 is a cross-sectional side view illustration of a sacrificial layer formed over a bulk LED substrate in accordance with an embodiment of the invention.

Referring now to FIG. 2 a sacrificial layer 140 is formed over the bulk LED substrate 100 and array of conductive contacts 120 in accordance with an embodiment of the invention. In an embodiment, sacrificial layer 140 is between approximately 0.5 and 2 microns thick. In an embodiment, sacrificial layer is formed of an oxide (e.g. $SiO_2$) or nitride (e.g. $Si_3N_4$), though other materials may be used which can be selectively removed with respect to the other layers. In an embodiment, sacrificial layer 140 is deposited by sputtering, low temperature plasma enhanced chemical vapor deposition (PECVD), or electron beam evaporation to create a low quality layer, which may be more easily removed than a higher quality layer deposited by other methods such as atomic layer deposition (ALD) or high temperature PECVD.

Still referring to FIG. 2, prior to the formation of sacrificial layer 140, an etch stop detection layer 130 may be formed. In an embodiment, etch stop detection layer 130 is titanium. Etch stop detection layer 130 may be formed by a variety of techniques such as sputtering or electron beam evaporation, and have a suitable thickness for visual observation during etching, for example, 100-300 angstroms.

After the formation of sacrificial layer 140, an adhesion promoter layer 144 may be formed in order to increase adhesion of the stabilization layer 150 (not yet formed) to the sacrificial layer 140. Increase of adhesion between the sacrificial layer 140 and the stabilization layer 150 may prevent delamination between the layers due to the stress of the device layer 105 resulting from heterogeneous epitaxial growth of device layer 105. A thickness of 100-300 angstroms may be sufficient to increase adhesion.

Specific metals that have good adhesion to both the sacrificial layer 140 and a BCB stabilization layer include, but are not limited to, titanium and chromium. For example, sputtered or evaporated titanium or chromium can achieve an adhesion strength (stud pull) of greater than 40 MPa with BCB.

Figure 3A:
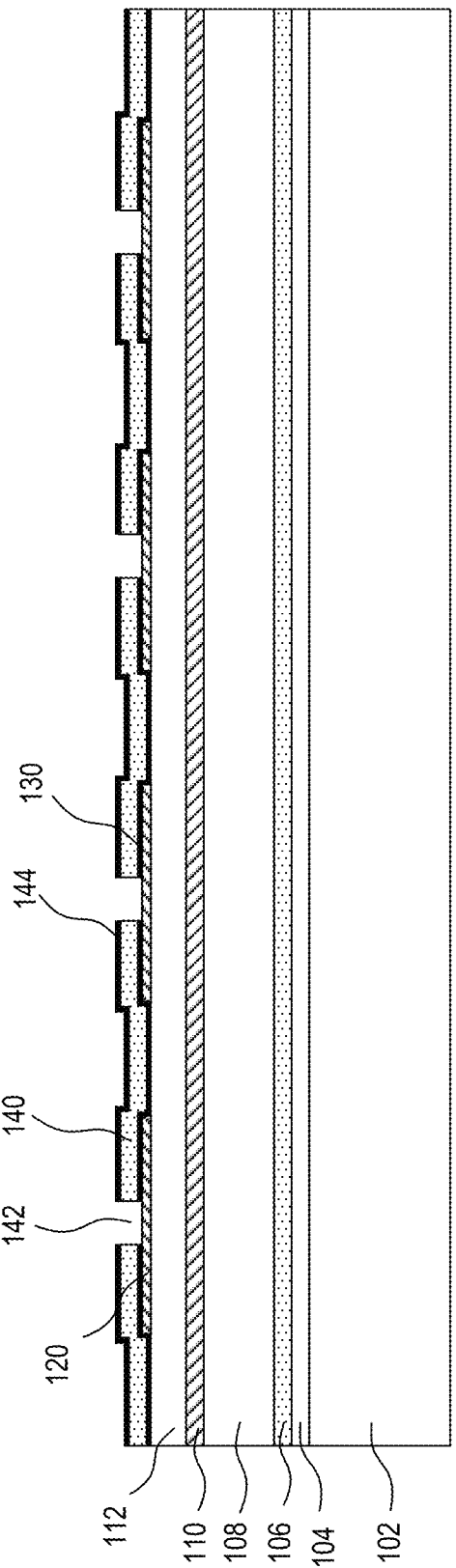

Referring now to FIG. 3A, the sacrificial layer 140 is patterned to form an array of openings 142 over the array of conductive contacts 120 in accordance with an embodiment of the invention. If adhesion layer 144, and/or etch stop detection layer 130 are present these layers may also be patterned to form the array of openings 142 through layers 144, 140, 130, exposing the array of conductive contacts 120. In accordance with embodiments of the invention, a $SiO_2$ or $Si_3N_4$ sacrificial layer 140 may be transparent, and endpoint etch detection cannot be easily determined with visual observation. Where a titanium etch stop detection layer 130 is present, a grayish color indicative of titanium can be visually observed during etching of the $SiO_2$ or $Si_3N_4$ sacrificial layer 140. The same etching chemistry (e.g. HF vapor, or $BCl_3$ and $Cl_2$ plasma) used to etch the $SiO_2$ or $Si_3N_4$ sacrificial layer 140 also etches through the titanium etch stop detection layer 130. Upon etching through layer 130, the grayish color associated with titanium disappears and the color of the underlying bonding layer 125 (e.g. gold) on the conductive contact 120 is visible. In this manner, the stop detection layer 130 allows for small post opening process inspection to ensure complete and uniform openings 142.

As will become more apparent in the following description the height, and length and width of the openings 142 in the sacrificial layer 140 correspond to the height, and length and width (area) of the stabilization posts to be formed, and resultantly the adhesion strength that must be overcome to pick up the array of micro LED devices poised for pick up on the array of stabilization posts. In an embodiment, openings 142 are formed using lithographic techniques and have a length and width of approximately 1 μm by 1 μm, though the openings may be larger or smaller so long as the openings have a width (or area) that is less than the width (or area) of the conductive contacts 120 and/or micro LED devices yet to be formed.

Figure 3D:
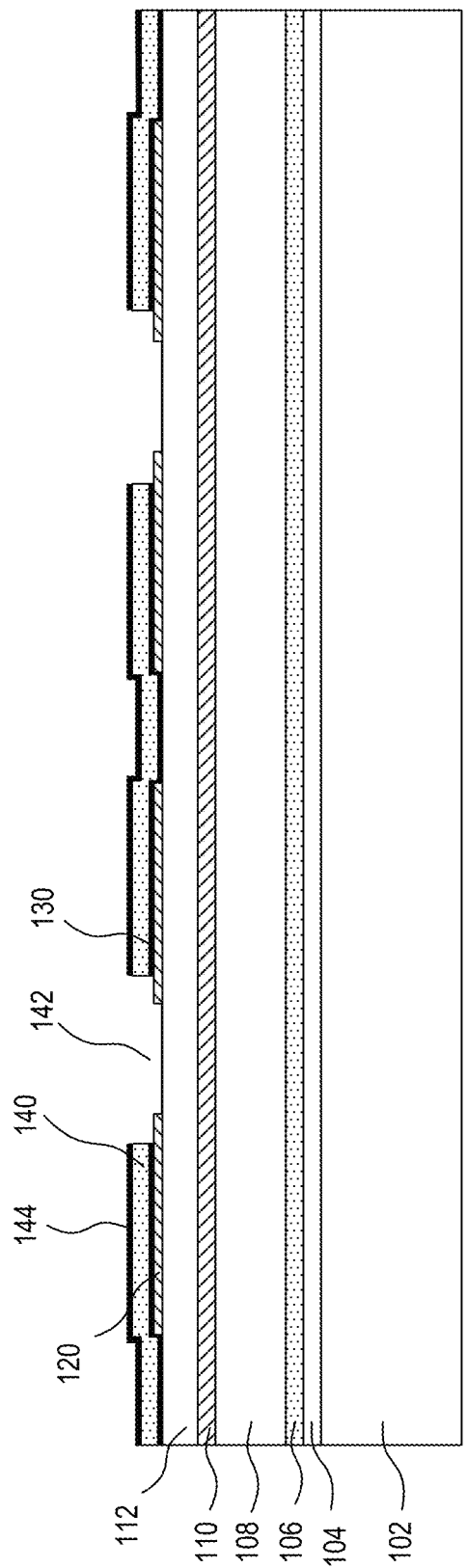

FIG. 3B is an illustration of an array of openings 142 over the array of conductive contacts 120 in which the array of openings 142 are off-centered from an x-y center for the corresponding array of conductive contacts 120, in accordance with an embodiment. As will become more apparent in the following description, the stabilization posts created in the off-centered openings 142 will also be off-centered from the corresponding micro devices. FIG. 3C is an illustration of multiple openings 142 formed over a single conductive contact 120 in accordance with an embodiment. For example, the multiple openings 142 may be at opposite corners of a conductive contact 120. FIG. 3D is an illustration of openings 142 spanning over and between the edges of two conductive contacts 120 in accordance with an embodiment. As will become more apparent in the following description, the stabilization posts created in the openings 142 span underneath and between two conductive contacts 120, and each conductive contact can be supported by more than one stabilization post.

Figure 4A:
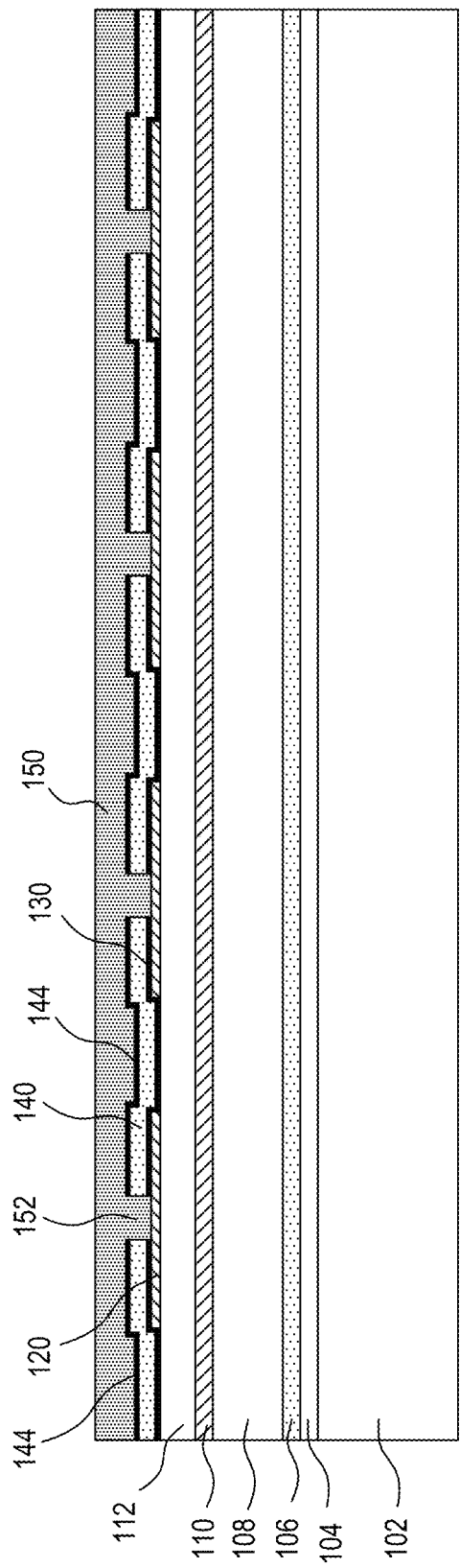
FIG. 4A is a cross-sectional side view illustration of a stabilization layer formed over and within openings in a patterned sacrificial layer a bulk LED substrate in accordance with an embodiment of the invention.

In accordance with embodiments of the invention, a stabilization layer 150 formed of an adhesive bonding material is then formed over the patterned sacrificial layer 140, as illustrated in FIG. 4A. In accordance with some embodiments, the adhesive bonding material is a thermosetting material such as benzocyclobutene (BCB) or epoxy. In an embodiment, the thermosetting material may be associated with 10% or less volume shrinkage during curing, or more particularly about 6% or less volume shrinkage during curing so as to not delaminate from the conductive contacts 120 on the micro devices to be formed. In order to increase adhesion to the underlying structure, in addition to, or in alternative to adhesion promoter layer 144, the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 150 over the patterned sacrificial layer 140.

In an embodiment, stabilization layer 150 is spin coated or spray coated over the patterned sacrificial layer 140, though other application techniques may be used. Following application of the stabilization layer 150, the stabilization may be pre-baked to remove the solvents. In an embodiment, the stabilization layer 150 is thicker than the height of openings 142 in the patterned sacrificial layer 140. In this manner, the thickness of the stabilization layer filling openings 142 will become stabilization posts 152, and the remainder of the thickness of the stabilization layer 150 over the filled openings 142 can function to adhesively bond the bulk LED substrate 100 a carrier substrate.

Figure 4B:
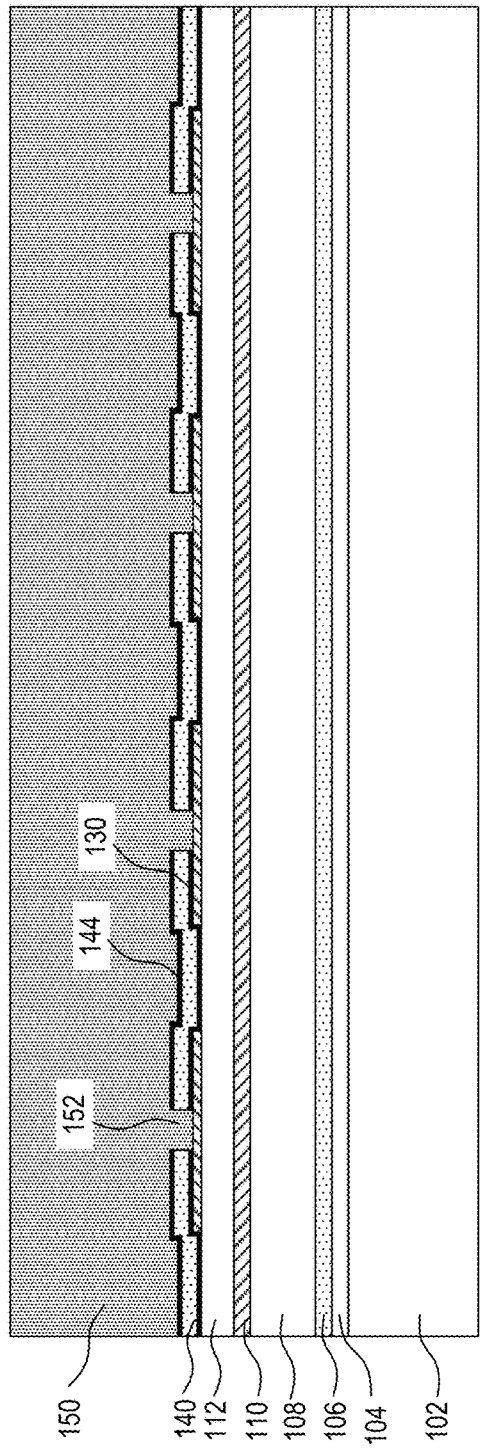
FIG. 4B is a cross-sectional side view illustration of a molded stabilization layer formed over and within openings in a patterned sacrificial layer a bulk LED substrate in accordance with an embodiment of the invention.

In accordance with another embodiment illustrated in FIG. 4B, the stabilization layer 150 can be formed over the patterned sacrificial layer 140 using a molding technique such as injection molding. In such an embodiment, the stabilization layer 150 may be fully cured during injection molding. The stabilization layer 150 may also be substantially thick so as to function as a carrier substrate.

Figure 5A:
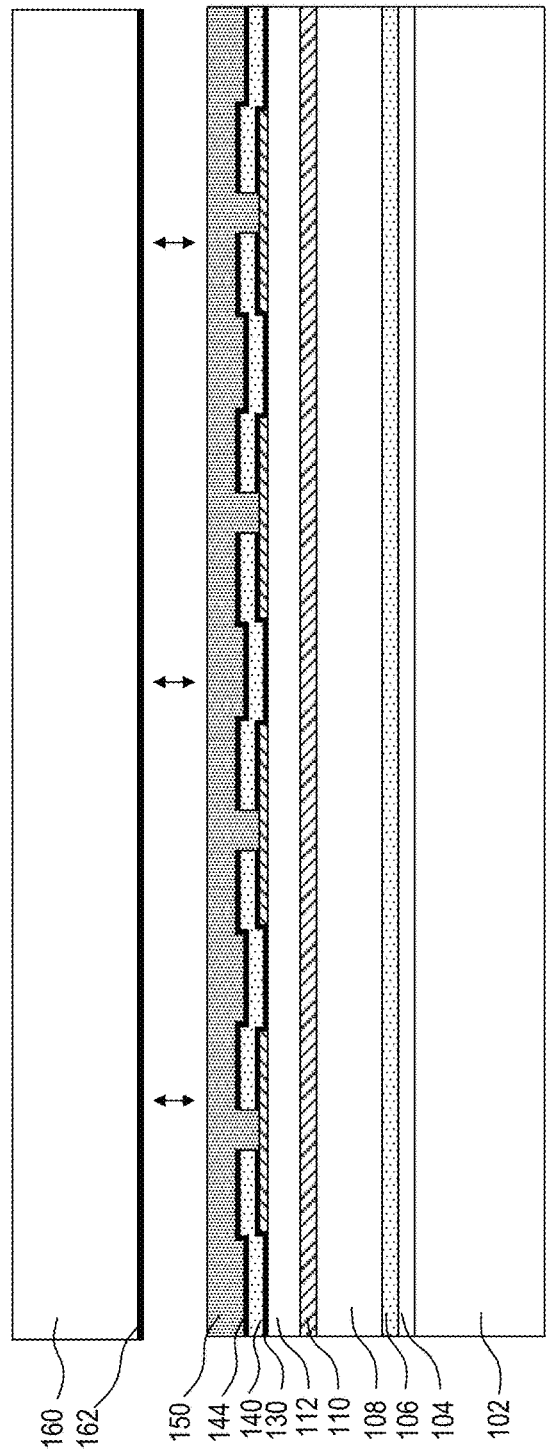
FIGS. 5A-5B are cross-sectional side view illustrations of bringing together a bulk LED substrate and a carrier substrate in accordance with embodiments of the invention.
Figure 5B:
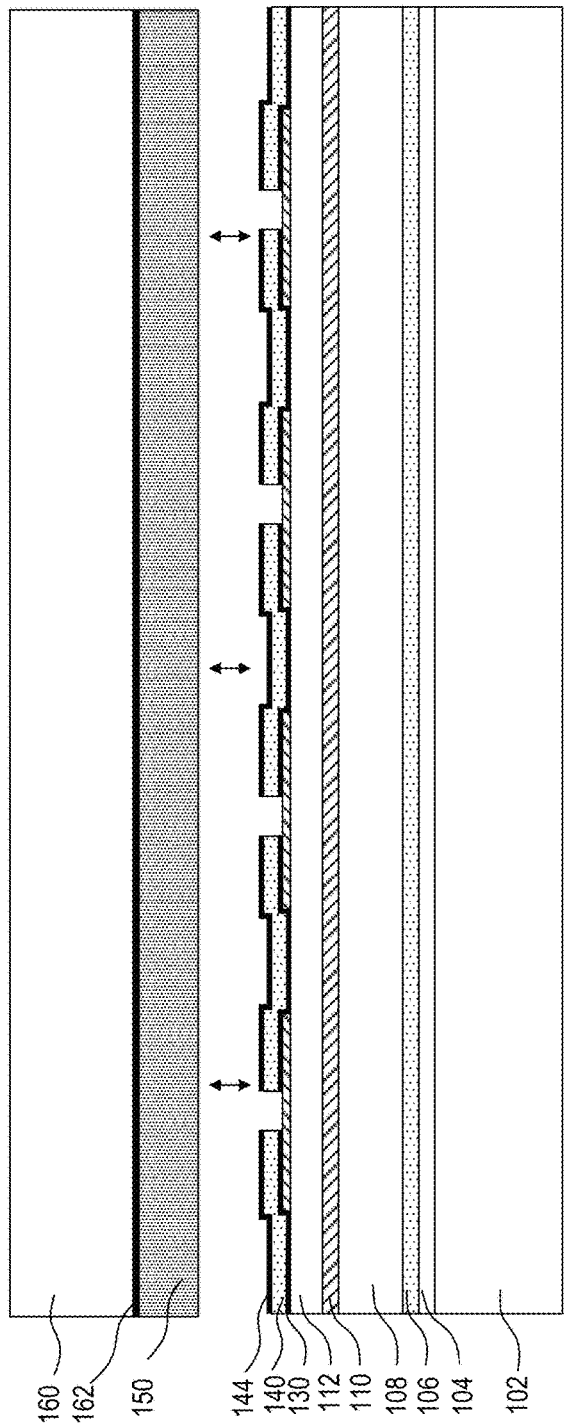
Figure 5C:
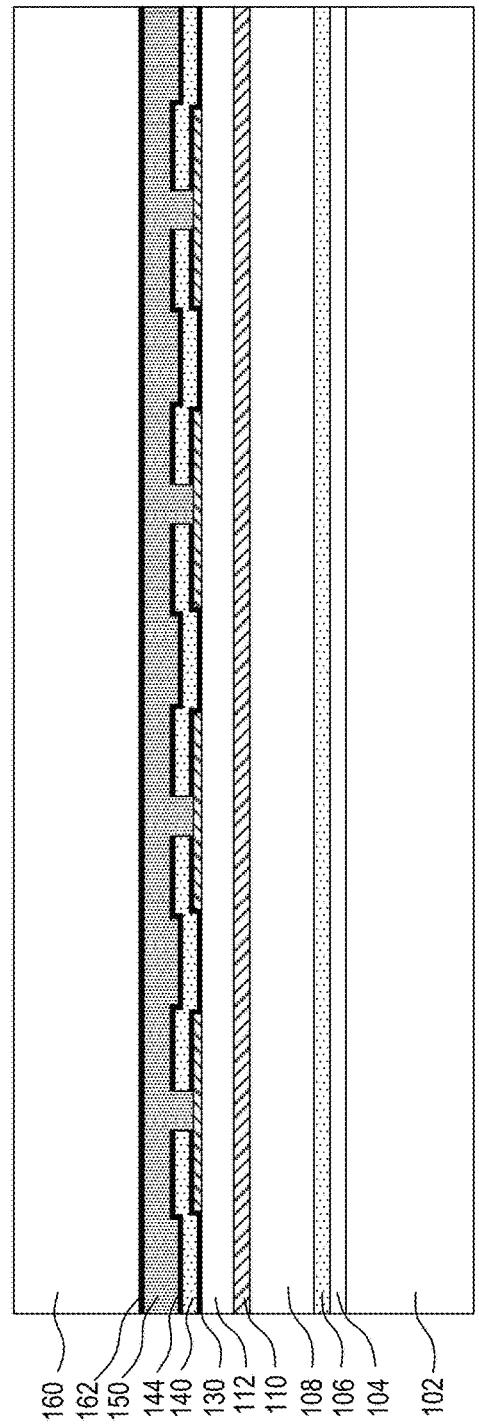
FIG. 5C is a cross-sectional side view illustration of a bulk LED substrate bonded to a carrier substrate in accordance with an embodiment of the invention.

Referring now to the embodiments illustrated in FIG. 5A-5C a bulk LED substrate illustrated in FIG. 4A is bonded to a carrier substrate 160 (such as silicon) with stabilization layer 150. In the embodiment illustrated in FIG. 5A, a stabilization layer 150 is applied over the surface of the bulk LED substrate. Alternatively or additionally, in the embodiment illustrated in FIG. 5B, a stabilization layer 150 is applied over the surface of the carrier substrate 160. Depending upon the particular material selected, stabilization layer 150 may be thermally cured, or cured with application of UV energy.

In order to increase adhesion with the stabilization layer 150 an adhesion promoter layer 162 can be applied to the carrier substrate 160 prior to bonding the bulk LED substrate 100 to the carrier substrate 160 similarly as described above with regard to adhesion promoter layer 144. Likewise, in addition to, or in alternative to adhesion promoter layer 144, an adhesion promoter such as AP3000 may be applied to the surface of the carrier substrate 160 or adhesion promoter layer 162.

In an embodiment, a stabilization layer 150 is cured at a temperature or temperature profile ranging between 150° C. and 300° C. Where stabilization layer 150 is formed of BCB, curing temperatures should not exceed approximately 350° C., which represents the temperature at which BCB begins to degrade. In accordance with embodiments including a bonding layer 125 material characterized by a liquidus temperature (e.g. gold, silver, bismuth) greater than 250° C., full-curing of a BCB stabilization layer 150 can be achieved in approximately 1 hour or less at a curing temperature between 250° C. and 300° C. Other bonding layer 125 materials such as Sn (231.9° C.) may require between 10-100 hours to fully cure at temperatures between 200° C. and the 231.9° C. liquidus temperature. In accordance with embodiments including a bonding layer 125 material characterized by a liquidus temperature below 200° C. (e.g. indium), a BCB stabilization layer 150 may only be partially cured (e.g. 70% or greater). In such an embodiment the BCB stabilization layer 150 may be cured at a temperature between 150° C. and the liquidus temperature of the bonding layer (e.g. 156.7° C. for indium) for approximately 100 hours to achieve at least a 70% cure.

Achieving a 100% full cure of the stabilization layer is not required in accordance with embodiments of the invention. More specifically, the stabilization layer 150 may be cured to a sufficient curing percentage (e.g. 70% or greater for BCB) at which point the stabilization layer 150 will no longer reflow. Moreover, it has been observed that such partially cured (e.g. 70% or greater) BCB stabilization layer 150 may possess sufficient adhesion strengths with the carrier substrate 160 and patterned sacrificial layer 140 (or any intermediate layer(s)). Accordingly, regardless of bonding layer 125 material, in an embodiment the stabilization layer is cured between 70% and fully cured and need only be cured sufficiently to resist the HF vapor etch release process described below with regard to FIGS. 10A-13B.

Figure 6:
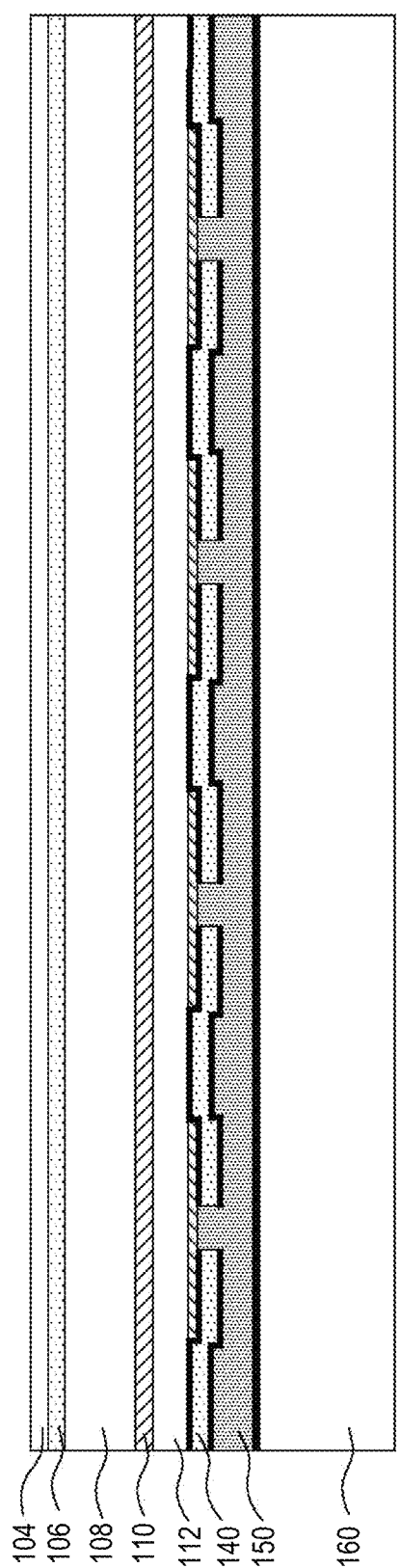
FIG. 6 is a cross-sectional side view illustration of the removal of a growth substrate in accordance with an embodiment of the invention.
Figure 7:
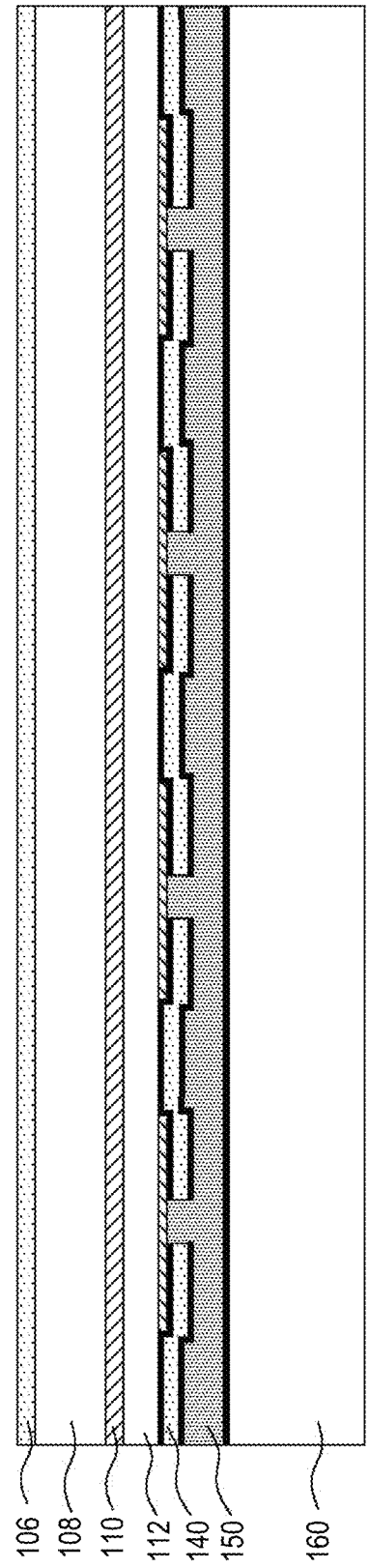
FIG. 7 is a cross-sectional side view illustration of the removal of an etch stop layer in accordance with an embodiment of the invention.

Referring now to FIG. 6, removal of the growth substrate 102 is illustrated in accordance with an embodiment of the invention. Removal may be accomplished by a variety of methods including laser lift off (LLO), grinding, and etching depending upon the material selection of the growth substrate 102. In the particular embodiment illustrated where growth substrate 102 is formed of GaAs, removal may be accomplished by etching, or a combination of grinding and selective etching, with the selective etching stopping on an etch stop layer 104. For example, the GaAs growth substrate 102 can be removed with a $H_2SO_4+H_2O_2$ solution, $NH_4OH+H_2O_2$ solution, or $CH_3OH+Br_2$ chemistry, stopping on etch stop layer 104 formed of InGaP, for example. The etch stop layer 104 may then be removed to expose the ohmic layer 106, as illustrated in FIG. 7. In an embodiment where etch stop layer is formed of InGaP, the etch stop layer may be removed by wet etching in a solution of $HCl+H_3PO_4$.

Figure 8A:
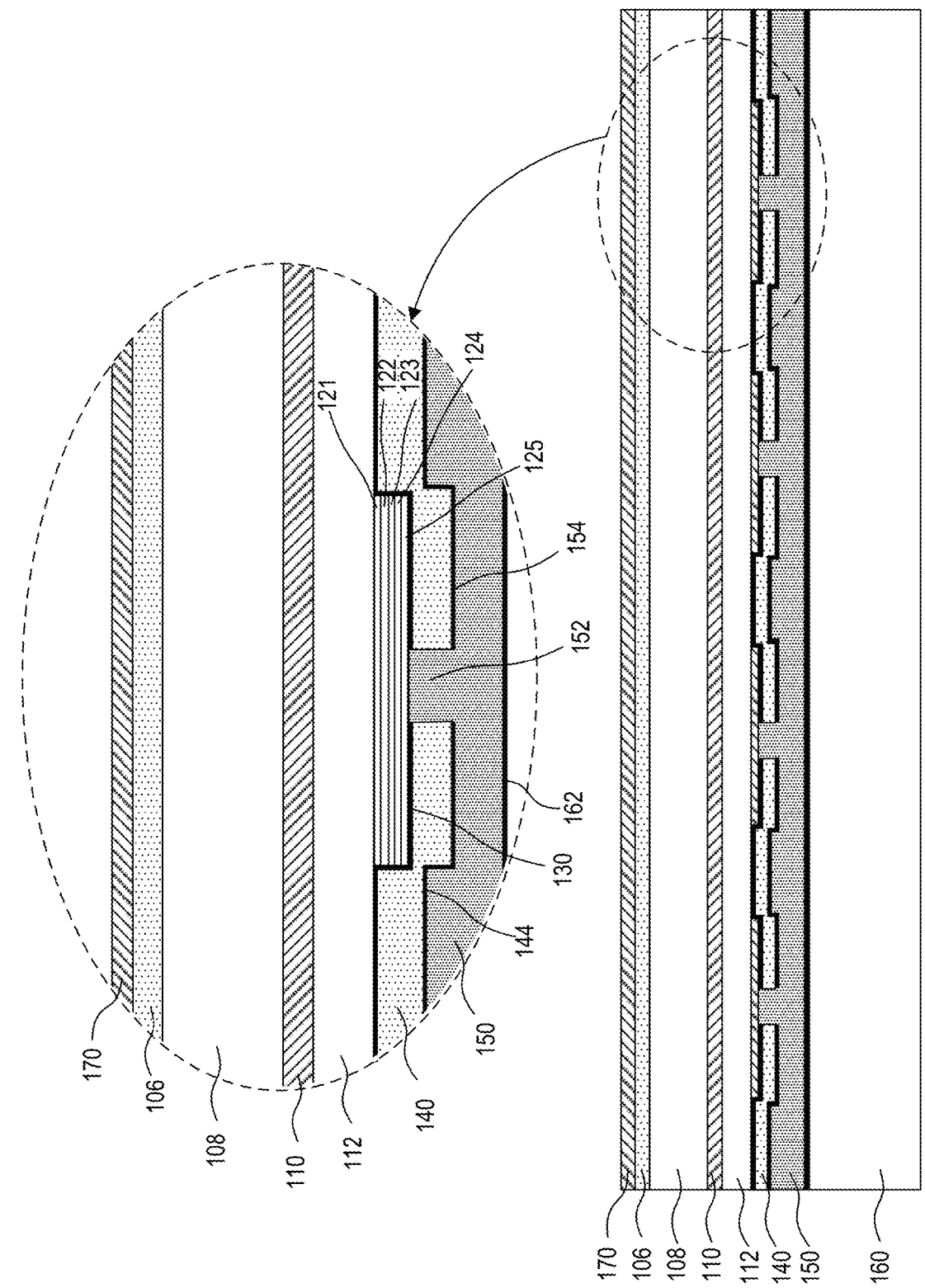
FIGS. 8A-8B are cross-sectional side view illustrations of a patterned conductive contact layer formed over a device layer in accordance with embodiments of the invention.
Figure 8B:
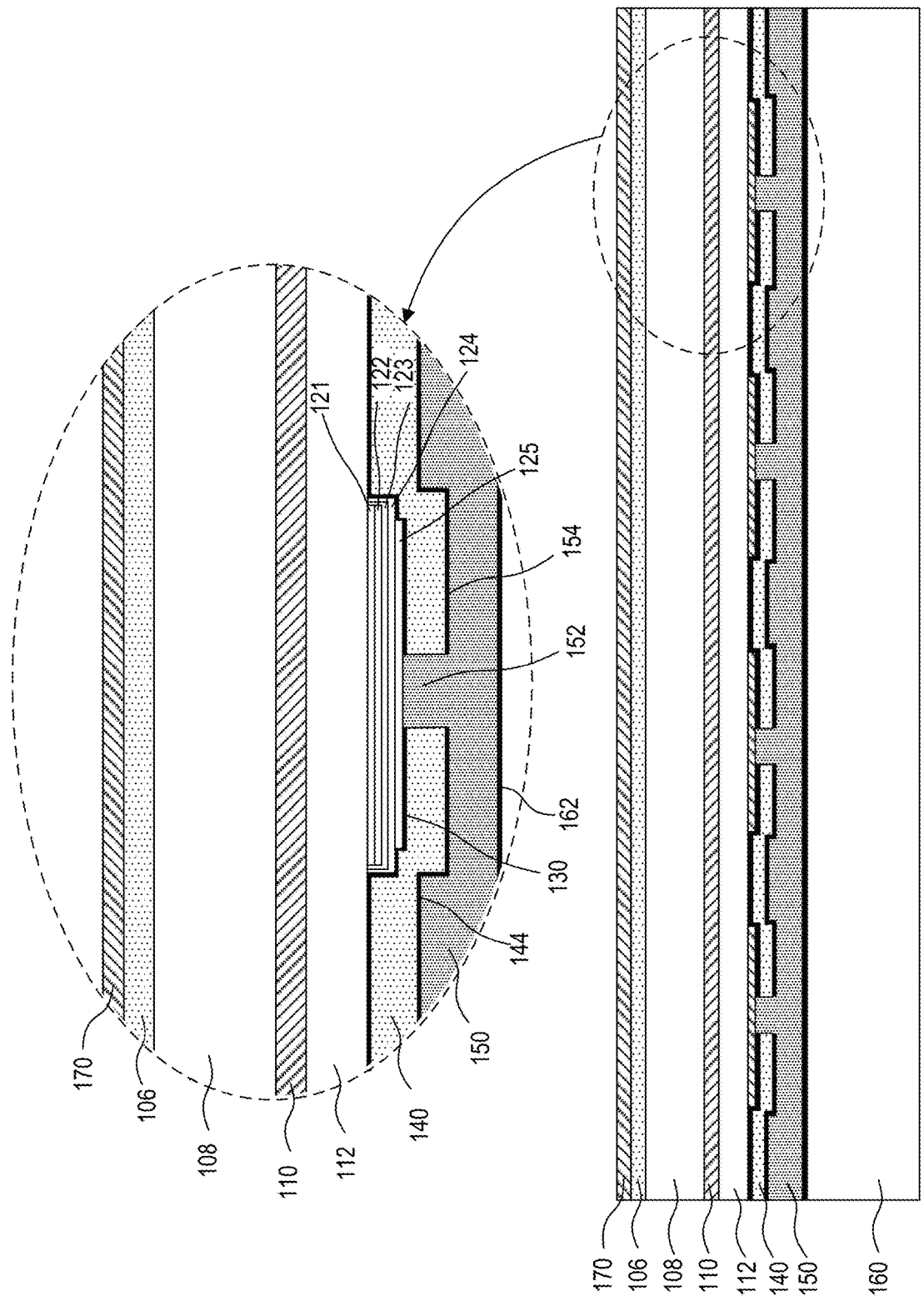

Referring now to the embodiments illustrated in FIGS. 8A-8B a conductive contact layer 170 is formed over the device layer 105. In the particular embodiments illustrated conductive contact layer 170 is formed on ohmic layer 106. Conductive contact layer 170 may be formed of a variety of conductive materials including metals, conductive oxides, and conductive polymers. In an embodiment, conductive contact layer 170 is formed using a suitable technique such as sputtering or electron beam physical deposition. For example, conductive contact layer 170 may include BeAu metal alloy, or a metal stack of Au/GeAuNi/Au layers. Conductive contact layer 170 may also be indium-tin-oxide (ITO). Conductive contact layer can also be a combination of one or more metal layers and a conductive oxide. In an embodiment, after forming the conductive contact layer 170, the substrate stack is annealed to generate an ohmic contact between conductive contact layer 170 and ohmic layer 106. Where the stabilization layer is formed of BCB, the annealing temperature may be below approximately 350° C., at which point BCB degrades. In an embodiment, annealing is performed between 200° C. and 350° C., or more particularly at approximately 320° C. for approximately 10 minutes.

In an embodiment a bonding layer 125 material (e.g. indium) is characterized by a liquidus temperature below the annealing temperature to generate the ohmic contact. In such an embodiment, the bonding layer 125 may be encapsulated by the cured stabilization layer 150, sacrificial layer 140, and the diffusion/barrier layers 124, 123 as illustrated in FIG. 8B. Further, even if the stabilization layer 150 is not already fully cured, the stabilization layer 150 may rapidly cure during anneal and encapsulate the liquefied bonding layer 125. In an embodiment, the etch stop detection layer 130 (if present) and bonding layer 125 materials are selected, along with anneal time and temperature so that minimal diffusion of materials occurs so that the melting temperature of bonding layer 125 is not significantly raised (e.g. above 350° C.). In an embodiment, the etch stop detection layer is not present if the bonding layer 125 has a liquidus temperature below the annealing temperature to generate ohmic contact. As described above, embodiments describe a manner of transfer of an array of micro devices that are poised for pick up on a carrier substrate to a receiving substrate. Where elevated temperatures are associated with the transfer process to liquefy a bonding layer material, these elevated temperatures may affect alignment of the electrostatic transfer head assembly. Accordingly, in an embodiment the liquidus temperature of the bonding layer material is maintained below 350° C. while on the carrier substrate.

Figure 9:
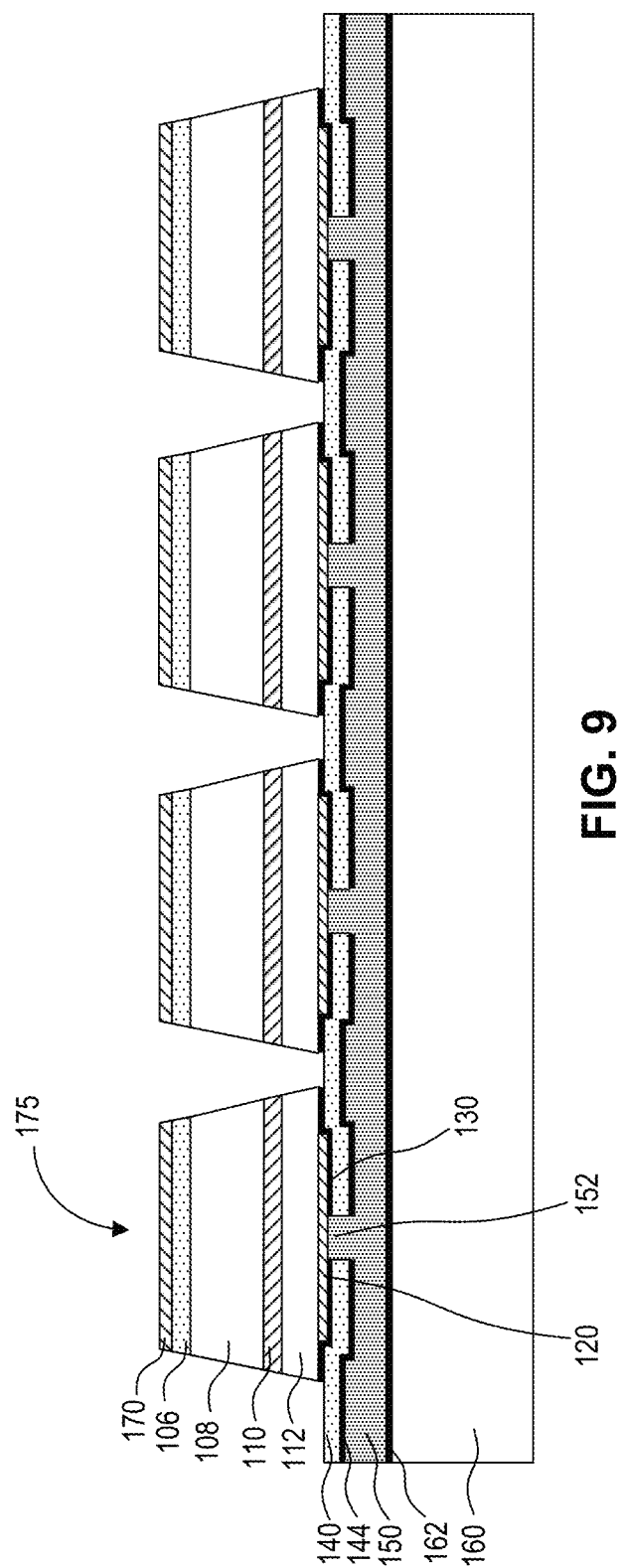
FIG. 9 is a cross-sectional side view illustration of an array of micro LED devices formed on an array of stabilization posts in accordance with an embodiment of the invention.

Referring now to FIG. 9, the conductive contact layer 170 and device layer 105 layers 106, 108, 110, 112 are patterned and etched to form an array of laterally separate micro devices 175. At this point, the resultant structure still robust for handling and cleaning operations to prepare the substrate for subsequent sacrificial layer removal and electrostatic pick up. In an exemplary embodiment where the array of micro devices have a pitch of 5 microns, each micro device may have a minimum width (e.g. along the top surface of layer 170) of 4.5 µm, and a separation between adjacent micro devices of 0.5 µm. It is to be appreciated that a pitch of 5 microns is exemplary, and that embodiments of the invention encompass any pitch of 1 to 100 µm as well as larger, and possibly smaller pitches. Etching of layers 170, 106, 108, 110, and 112 may be accomplished using suitable etch chemistries for the particular materials. For example, AlGaInP n-doped layer 108, quantum well layer(s) 110a GaP, and p-doped layer 112 may be dry etched in one operation with a BCl₃ and Cl₂ chemistry stopping on the sacrificial layer 140.

If an etch stop detection layer 130 is present, the etching chemistry used for etching through the device layers 105 may also remove the etch stop detection layer 130. Etch stop detection through the device layer 105 may be visually detected with an optical microscope when etch stop detection layer 130 is present. In the particular embodiment illustrated, the device layer 105 for a red LED may be exhibit an opaque orange/red/yellow color variation. Once the device layer 105 is etched through the grayish color of a titanium etch stop detection layer 130 may flash across the wafer, providing an indication that etching through the device layer 105 is complete. If the titanium etch stop detection layer 130 is etched through, the appearance of the non-transparent adhesion layer(s) 144, 162 (e.g Cr, Ti) or substrate 160 (e.g. Si) may then be observed if the sacrificial layer 140 and stabilization layer 150 are transparent.

Figure 10A:
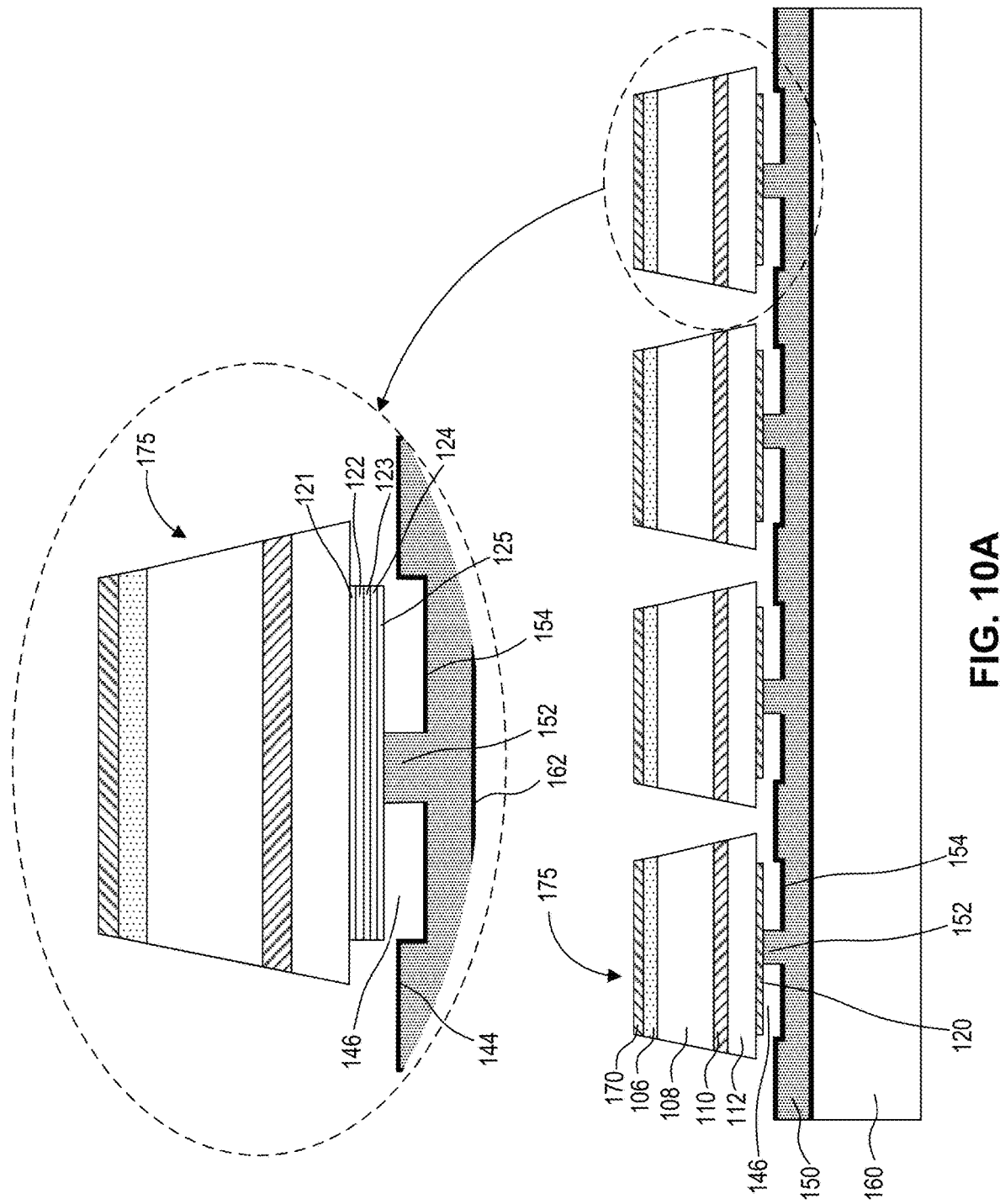
FIGS. 10A-10B are cross-sectional side view illustration of an array of micro LED devices formed on an array of stabilization posts after removal of the sacrificial layer in accordance with embodiments of the invention.
Figure 10B:
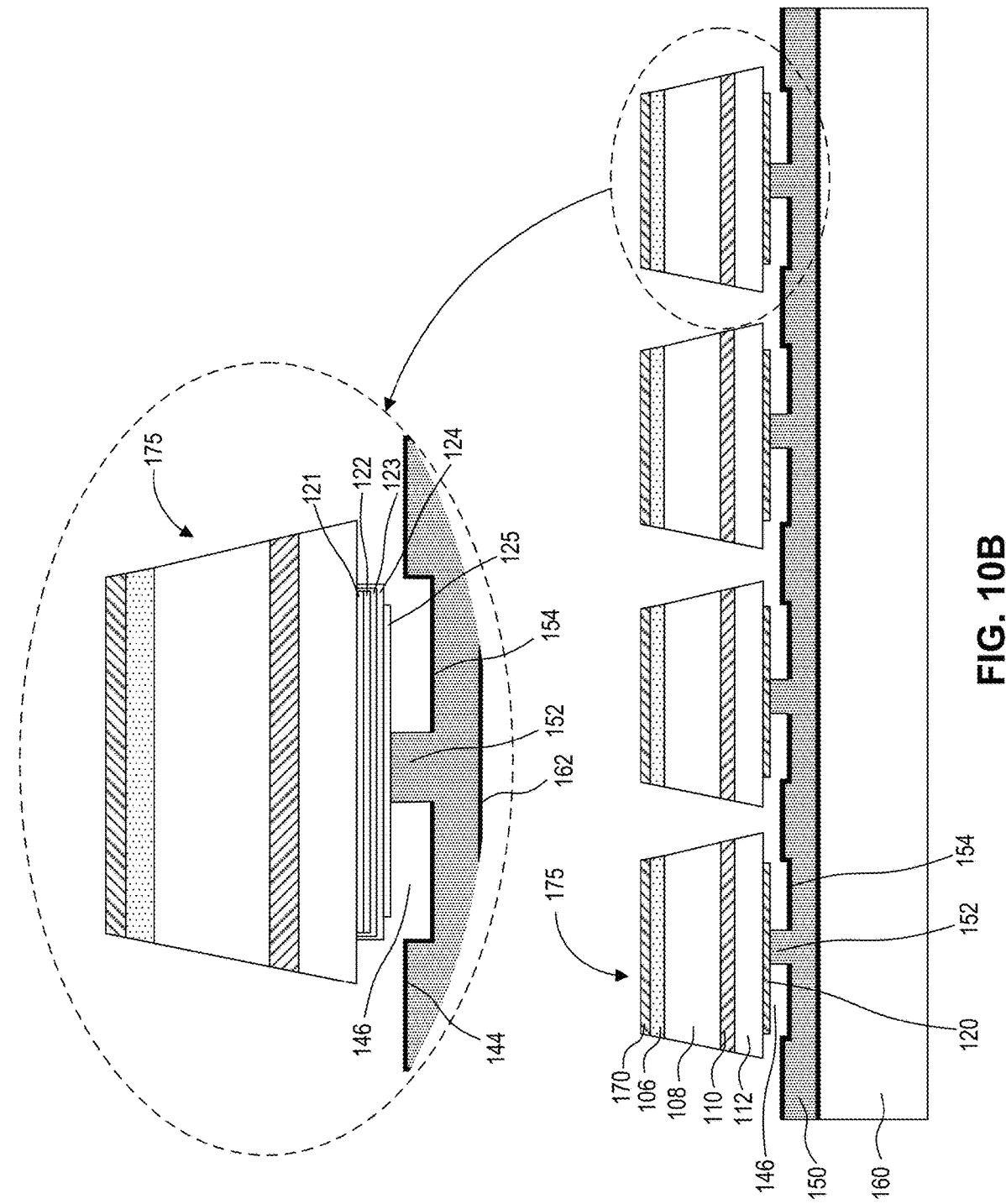

Following the formation of laterally separate micro devices 175, the sacrificial layer 140 may be removed. FIGS. 10A-10B are cross-sectional side view illustration of an array of micro LED devices formed on an array of stabilization posts after removal of the sacrificial layer in accordance with embodiments of the invention. FIGS. 10A and 10B are substantially similar, with the only difference being the arrangement of layers within conductive contacts 120. In the embodiments illustrated, sacrificial layer 140 is completely removed resulting in an open space 146 below each micro device 175. A suitable etching chemistry such as (e.g. HF vapor, or BCl₃ and Cl₂ plasma) used to etch the SiO₂ or Si₃N₄ sacrificial layer 140 also removes the titanium etch stop detection layer 130 if present.

In an embodiment, the array of micro devices 175 are on the array of stabilization posts 152, and supported only by the array of stabilization posts 152. In addition, the top surface of stabilization layer 150 may include a cavity 154 with a width corresponding to the approximate width of conductive contact 120. The cavity 154 may act to contain bonding layer 125 if the bonding layer is liquefied during a pick up operation and help prevent the spreading of the bonding layer 125 to an adjacent micro device 175.

Figure 10C:
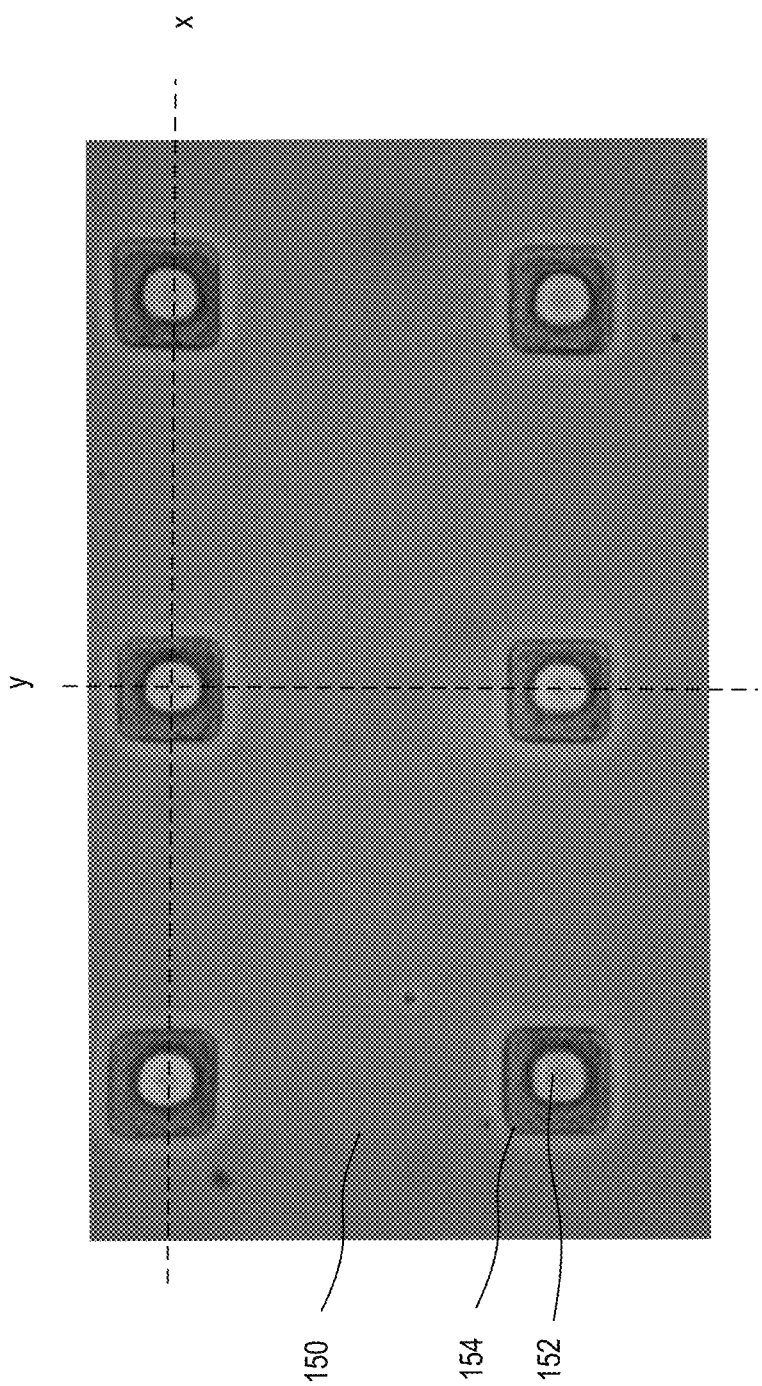
FIG. 10C is a top view image of a stabilization layer including stabilization posts after an array of micro devices have been picked up in accordance with an embodiment of the invention.

FIG. 10C is a top view image of a stabilization layer including stabilization posts after an array of micro devices have been picked up in accordance with an embodiment of the invention. As shown, the array of stabilization posts 152 is centered in the x-y directions in the cavities 154. As described above, the cavities have a width in the x-y directions corresponding to the approximate width of conductive contact 120. Thus, in the embodiments illustrated in FIGS. 10A-10C, the array of stabilization posts is centered beneath the array of micro devices 175.

Figure 11A:
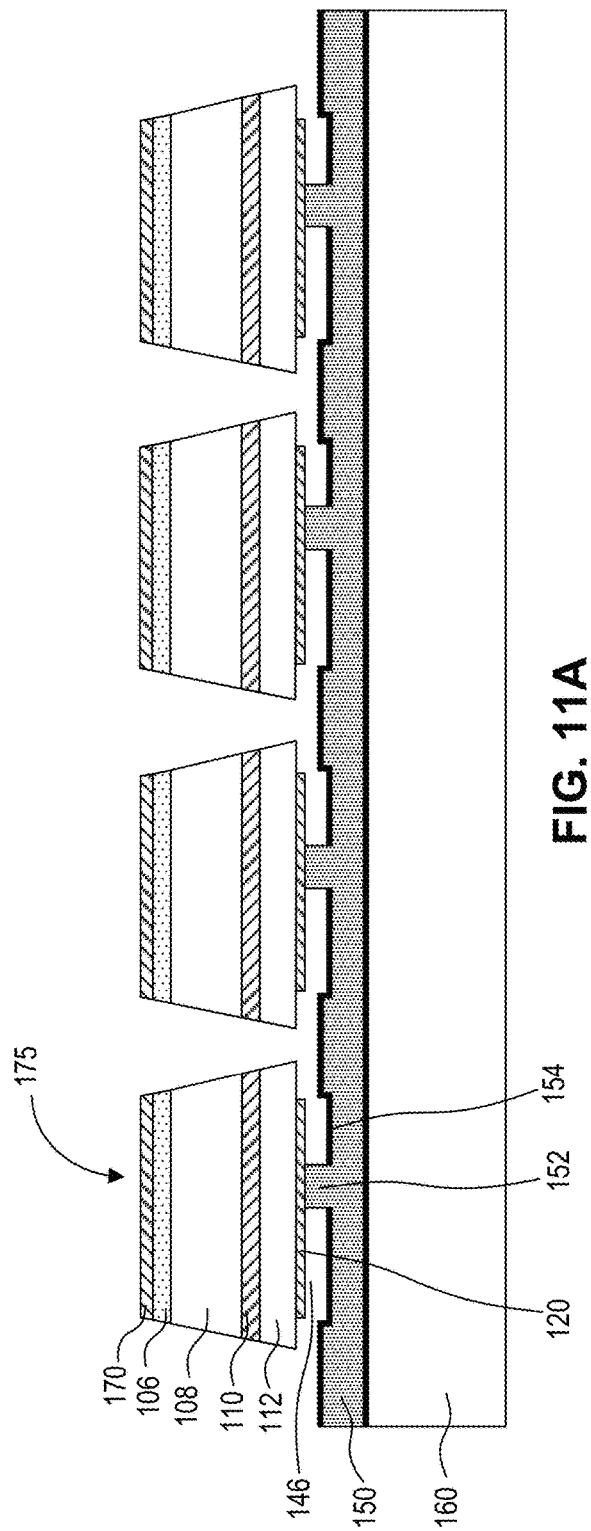
FIG. 11A is cross-sectional side view illustration of an array of micro LED devices formed on an array of stabilization posts after removal of the sacrificial layer in accordance with an embodiment of the invention.

Referring now to FIG. 11A, a cross-sectional side view illustration of an array of micro LED devices is provided after the removal of the sacrificial layer in accordance with an embodiment. In particular, the array of stabilization posts 152 is off-centered from an x-y center for the corresponding array of conductive contacts 120 of the array of micro LED devices 175. For example, the particular structure illustrated in FIG. 11A may be formed using the array of openings 142 described above with regard to FIG. 3B.

Figure 11B:
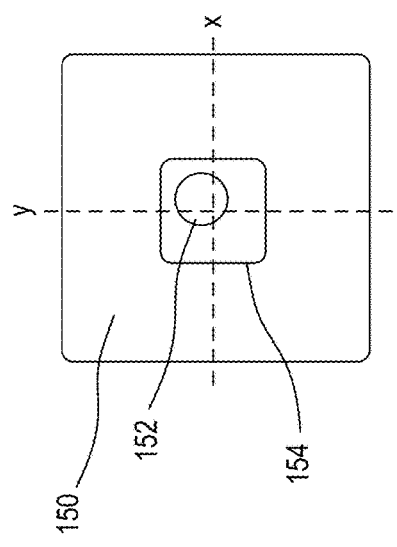
FIG. 11B is a schematic top view illustration of stabilization post location in accordance with embodiments of the invention.

FIG. 11B is a schematic top view illustration of a stabilization post location in accordance with embodiments of the invention. As shown, the stabilization post 152 is off-centered from an x-y center for the corresponding cavity 154, which corresponds to the approximate size of conductive contact 120. Thus, in the embodiments illustrated in FIGS. 11A-11B, the array of stabilization posts is off-centered from an x-y center below the array of micro devices 175. In an embodiment, during the pick up operation described below the off-centered stabilization posts 152 may provide for the creation of a moment when the array of transfer heads contact the array of micro devices in which the micro devices tilt slightly as a result of the applied downward pressure from the array of transfer heads. This slight tilting may aid in overcoming the adhesion strength between the stabilization posts 152 and the array of micro devices 175. Furthermore, such assistance in overcoming the adhesion strength may potentially allow for picking up the array of micro devices with a lower grip pressure. Consequently, this may allow for operation of the array of transfer heads at a lower voltage, and impose less stringent dielectric strength requirements in the dielectric layer covering each transfer head required to achieve the electrostatic grip pressure.

Figure 12A:
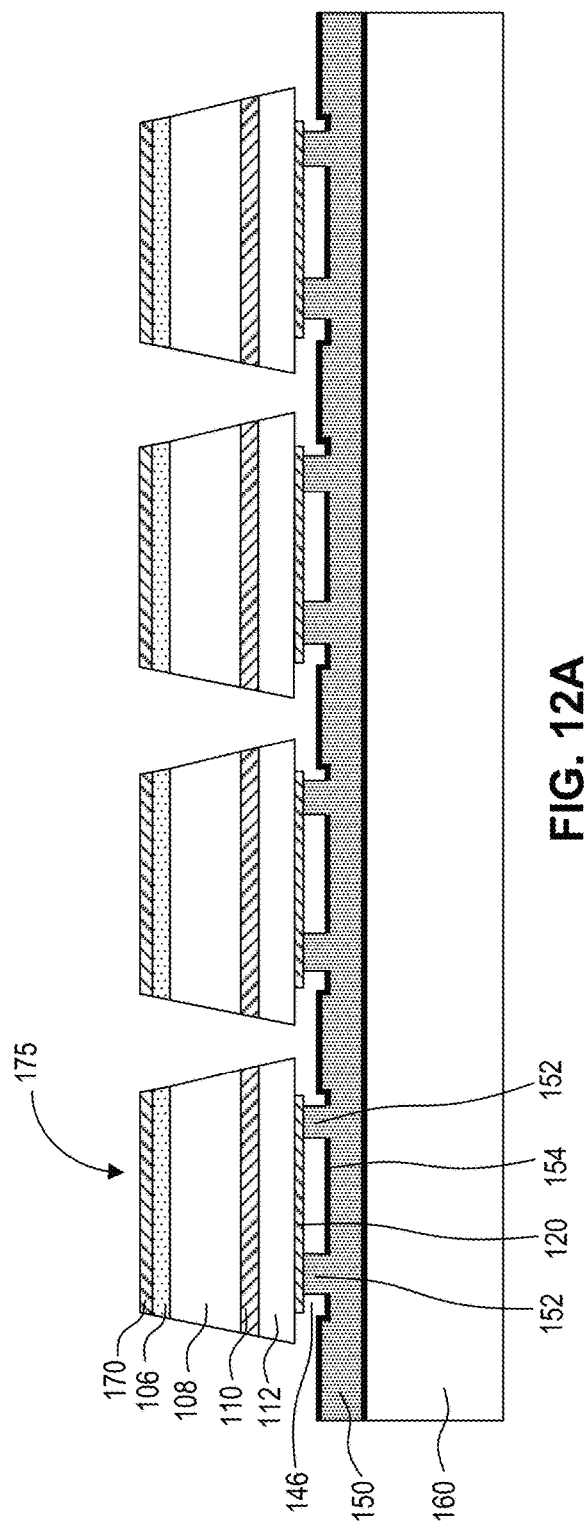
FIG. 12A is cross-sectional side view illustration of an array of micro LED devices formed on an array of stabilization posts after removal of the sacrificial layer in accordance with an embodiment of the invention.

Referring now to FIG. 12A, a cross-sectional side view illustration of an array of micro LED devices is provided after the removal of the sacrificial layer in accordance with an embodiment. In particular, two or more stabilization posts 152 are allocated for each corresponding conductive contact 120 in the array of micro LED devices 175. In an embodiment, each conductive contact 120 is associated with two stabilization posts 152, at opposite corners of the conductive contact. For example, the particular structure illustrated in FIG. 12A may be formed using the array of openings 142 described with regard to FIG. 3C.

Figure 12B:
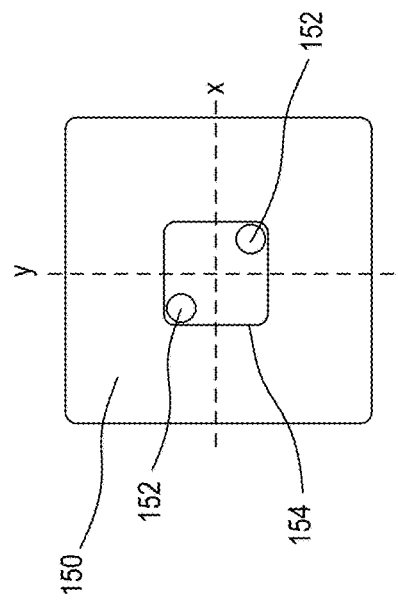
FIG. 12B is a schematic top view illustration of stabilization post location in accordance with embodiments of the invention.

FIG. 12B is a schematic top view illustration of stabilization post locations in accordance with embodiments of the invention. As shown, the stabilization posts 152 are at opposite corners of the corresponding cavity 154, which corresponds to the approximate size of conductive contact 120. Thus, in the embodiments illustrated in FIGS. 12A-12B, the array of stabilization posts 152 is off-centered from an x-y center below the array of micro devices 175. In an embodiment, during the pick up operation described below the off-centered stabilization posts 152 may provide for the creation of a moment when the array of transfer heads contact the array of micro devices in which the micro devices tilt slightly as a result of the applied downward pressure from the array of transfer heads. In an embodiment, supporting a micro device 175 with more than one stabilization post 152 may allow for the formation of smaller stabilization posts, which may also reduce the amount of contact area between the stabilization posts 152 and the micro devices 175, and reduce the total adhesion strength required to be overcome during the pick up operation.

Referring now to FIG. 13A, a cross-sectional side view illustration of an array of micro LED devices is provided after the removal of the sacrificial layer in accordance with an embodiment. In particular, stabilization posts 152 span underneath and between the edges of two adjacent conductive contacts 120. For example, the particular structure illustrated in FIG. 13A may be formed using the array of openings 142 described with regard to FIG. 3D. While not illustrated in FIG. 13A, each conductive contact 120 can be supported by more than one stabilization post 152.

FIG. 13B is a schematic top view illustration of stabilization post locations in accordance with embodiments of the invention. As shown, the stabilization posts 152 span between the edges of two adjacent cavities 154, which corresponds to the approximate size of conductive contacts 120. Thus, in the embodiments illustrated in FIGS. 13A-13B, the array of stabilization posts 152 is off-centered from an x-y center below the array of micro devices 175. In an embodiment, during the pick up operation described below the off-centered stabilization posts 152 may provide for the creation of a moment when the array of transfer heads contact the array of micro devices in which the micro devices tilt slightly as a result of the applied downward pressure from the array of transfer heads. In an embodiment, staggering the array of stabilization posts 152 between the edges of two adjacent cavities 154 may also reduce the amount of contact area between the stabilization posts 152 and the micro devices 175, and reduce the total adhesion strength required to be overcome during the pick up operation.

Figure 14C:
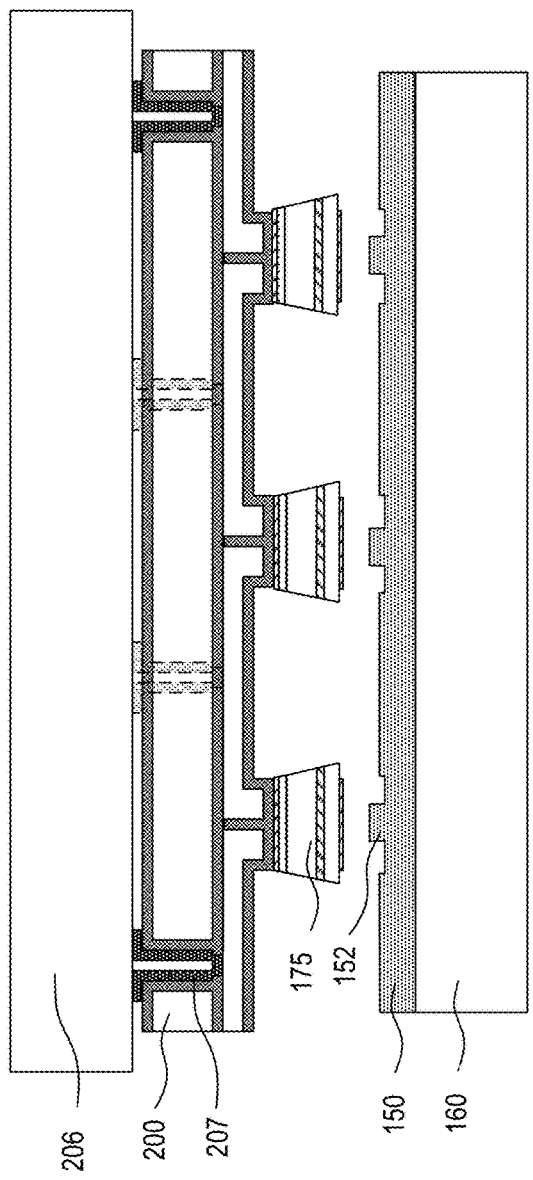
FIG. 14C is a cross-sectional side view illustration of an array of electrostatic transfer heads picking up an array of micro devices in accordance with an embodiment of the invention.
Figure 14D:
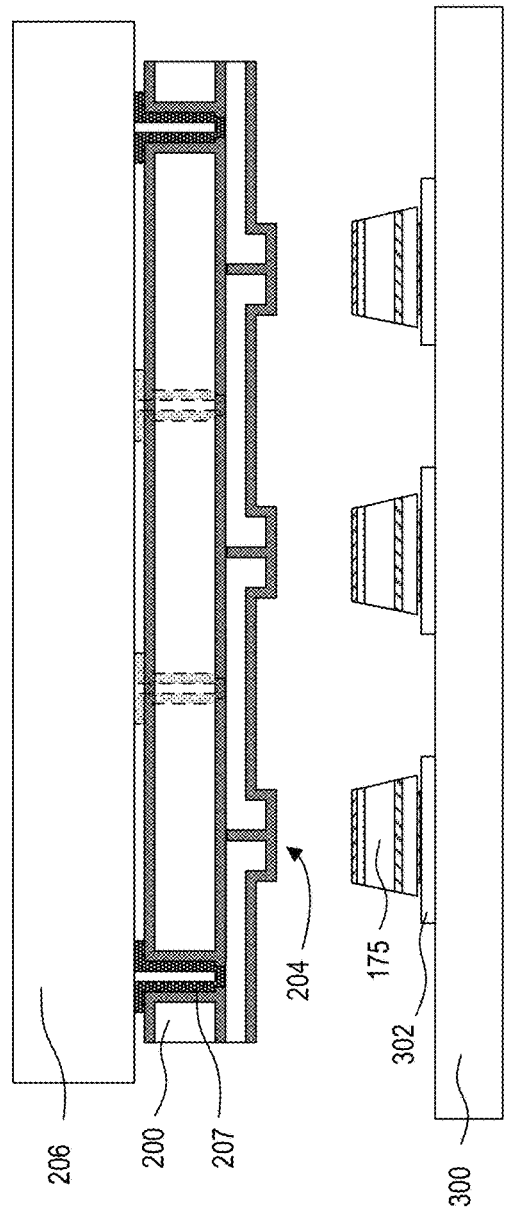
FIG. 14D is a cross-sectional side view illustration of an array of micro devices released onto a receiving substrate in accordance with an embodiment of the invention.

FIGS. 14A-14D are cross-sectional side view illustrations of a method of picking up and transferring an array of micro devices from a carrier substrate to a receiving substrate in accordance with an embodiment of the invention. FIG. 14A is a cross-sectional side view illustration of an array of micro device transfer heads 204 supported by substrate 200 and positioned over an array of micro devices 175 stabilized on stabilization posts 152 of stabilization layer 150 on carrier substrate 160 in accordance with an embodiment of the invention. The array of micro devices 175 are then contacted with the array of transfer heads 204 as illustrated in FIG. 14B. As illustrated, the pitch of the array of transfer heads 204 is an integer multiple of the pitch of the array of micro devices 175. If the array of stabilization posts 152 are off-centered with an x-y center below the array of micro devices this may create a moment between the array of micro devices 175 and array of stabilization posts 152. A voltage is applied to the array of transfer heads 204. The voltage may be applied from the working circuitry within a transfer head assembly 206 in electrical connection with the array of transfer heads through vias 207. The array of micro devices 175 is then picked up with the array of transfer heads 204 as illustrated in FIG. 14C. The array of micro devices 175 is then released onto contact pads 302 (e.g. gold, indium, or tin) on receiving substrate 300 as illustrated in FIG. 14D. For example, the receiving substrate may be, but is not limited to, a display substrate, a lighting substrate, a substrate with functional devices such as transistors or ICs, or a substrate with metal redistribution lines.

In one embodiment, an operation is performed to create a phase change in a bonding layer connecting the array of micro devices 175 to the stabilization posts prior to or while picking up the array of micro devices. For example, the bonding layer may have a liquidus temperature less than 350° C., or more specifically less than 200° C. In an embodiment, the bonding layer is a material such as indium or an indium alloy. If a portion of the bonding layer is picked up with the micro device, additional operations can be performed to control the phase of the portion of the bonding layer during subsequent processing. For example, heat can be applied to the bonding layer from a heat source located within the transfer head assembly 206, carrier substrate 160, and/or receiving substrate 300.

The operation of applying the voltage to create a grip pressure on the array of micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after creating a phase change in the bonding layer.

Where the transfer heads 204 include bipolar electrodes, an alternating voltage may be applied across a the pair of electrodes in each transfer head 204 so that at a particular point in time when a negative voltage is applied to one electrode, a positive voltage is applied to the other electrode in the pair, and vice versa to create the pickup pressure. Releasing the array of micro devices from the transfer heads 204 may be accomplished with a varied of methods including turning off the voltage sources, lower the voltage across the pair of silicon electrodes, changing a waveform of the AC voltage, and grounding the voltage sources.

In utilizing the various aspects of this invention, it would become apparent to one skilled in the art that combinations or variations of the above embodiments are possible for stabilizing an array of micro devices on a carrier substrate, and for transferring the array of micro devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A structure comprising:
   a stabilization layer comprising an array of stabilization posts;
   an array of micro devices supported by the array of stabilization posts, wherein each micro device includes bottom surface that is wider than a corresponding stabilization post directly underneath the bottom surface;
   a sacrificial layer between the stabilization layer and the array of micro devices; and
   an adhesion promoter layer on the sacrificial layer and between the sacrificial layer and the stabilization layer;
   wherein the stabilization layer spans across the adhesion promoter layer and extends through a thickness of the sacrificial layer to form the array of stabilization posts that support the array of micro devices.

2. The structure of claim 1, wherein the adhesion promoter layer comprises a material selected from the group consisting of titanium and chromium.

3. The structure of claim 1, wherein the stabilization layer is formed of a thermoset material.

4. The structure of claim 1, wherein the array of micro devices is an array of micro LED devices, each micro LED with a maximum x-y dimension of 1 to 100 μm.

5. The structure of claim 1, wherein the stabilization layer extends through an array of openings formed through the adhesion promoter layer and the sacrificial layer.

6. The structure of claim 1, further comprising an array of bottom conductive contacts on the bottom surfaces of the array of micro devices.

7. The structure of claim 6, wherein each micro device includes a corresponding bottom contact, and one or more corresponding stabilization posts.

8. The structure of claim 7, wherein the bottom contact comprises a multiple layer stack.

9. The structure of claim 8, wherein the multiple layer stack includes a mirror layer.

10. The structure of claim 8, wherein the multiple layer stack comprises:
    an electrode layer;
    a mirror layer on the electrode layer;
    a barrier layer on the mirror layer; and
    a diffusion barrier layer on the electrode layer.

11. The structure of claim 10, wherein the electrode layer compress nickel, the mirror layer comprises silver, the barrier layer comprises titanium, and the diffusion barrier layer comprises platinum.

12. The structure of claim 10, wherein the multiple layer stack further comprises a bonding layer on the diffusion barrier layer.

13. The structure of claim 12, wherein the bonding layer comprises a noble metal.

14. The structure of claim 8, wherein the multiple layer stack comprises:
    an electrode layer;
    a mirror layer on the electrode layer; and
    a barrier layer on the mirror layer;
    wherein the barrier layer wraps around sidewalls of the electrode layer and the mirror layer.

15. The structure of claim 14, wherein the multiple layer stack further comprises a diffusion barrier layer on the electrode layer, wherein the diffusion barrier layer wraps around sidewalls of the electrode layer and the mirror layer.

16. The structure of claim 14, further comprising a bonding layer on the barrier layer.

17. The structure of claim 16, wherein the bonding layer comprises a noble metal.

18. The structure of claim 8, wherein the stabilization layer is bonded to a carrier substrate.

19. The structure of claim 18, wherein the carrier substrate comprises silicon.

* * * * *